(12) United States Patent
Jeong et al.

(10) Patent No.: US 11,264,433 B2
(45) Date of Patent: Mar. 1, 2022

(54) DISPLAY DEVICE

(71) Applicant: Samsung Display Co., Ltd., Yongin-si (KR)

(72) Inventors: Yeri Jeong, Yongin-si (KR); Dongjin Moon, Yongin-si (KR); Inyoung Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/846,108

(22) Filed: Apr. 10, 2020

(65) Prior Publication Data

US 2020/0381486 A1    Dec. 3, 2020

(30) Foreign Application Priority Data

May 31, 2019    (KR) .................. 10-2019-0064736

(51) Int. Cl.
*H01L 27/32*    (2006.01)

(52) U.S. Cl.
CPC ........ *H01L 27/323* (2013.01); *H01L 27/3276* (2013.01)

(58) Field of Classification Search
CPC ............... H01L 27/323; H01L 27/3276; H01L 27/3246; H01L 27/3248; H01L 27/3262; H01L 27/3279; G06F 2203/04111; G06F 2203/04103; G06F 2203/04112; G06F 3/0446; G06F 3/0443; G06F 3/0412
See application file for complete search history.

(56) References Cited

U.S. PATENT DOCUMENTS

| | | |
|---|---|---|
| 9,287,528 B2 | 3/2016 | Kim |
| 2013/0015865 A1 | 1/2013 | Izumi |
| 2018/0089485 A1 | 3/2018 | Bok |

(Continued)

FOREIGN PATENT DOCUMENTS

| | | |
|---|---|---|
| CN | 108873512 A | 11/2018 |
| CN | 109064902 A | 12/2018 |
| EP | 3410270 A2 | 12/2018 |

(Continued)

OTHER PUBLICATIONS

EPO Extended Search report dated Nov. 13, 2020, issued in corresponding European Patent Application No. 20176966.8 (11 pages).

*Primary Examiner* — Kyoung Lee
(74) *Attorney, Agent, or Firm* — Lewis Roca Rothgerber Christie LLP

(57) ABSTRACT

A display device includes: a substrate including an opening and a display area surrounding the opening; a plurality of display elements in the display area and including a first display element and a second display element spaced apart from each other about the opening; an input sensing layer on the plurality of display elements and including two first sensing electrodes spaced apart from each other around the opening and two second sensing electrodes spaced apart from each other around the opening; and a plurality of segments between the opening and the display area, wherein the plurality of segments comprise: a first segment electrically connected to one of the two first sensing electrodes through a first line; and a second segment electrically connected to the first segment through a second line.

35 Claims, 21 Drawing Sheets

(56) References Cited

U.S. PATENT DOCUMENTS

2018/0348929 A1    12/2018  Rhe et al.
2020/0110495 A1*   4/2020   Han ..................... G06F 3/0412

FOREIGN PATENT DOCUMENTS

| EP | 3660917 A1 | 6/2020 |
| KR | 10-2017-0137230 A | 12/2017 |
| KR | 10-2018-0131764 A | 12/2018 |
| KR | 10-1947019 B1 | 2/2019 |

* cited by examiner

DISPLAY DEVICE

CROSS-REFERENCE TO RELATED APPLICATION

This application claims priority to and the benefit of Korean Patent Application No. 10-2019-0064736, filed on May 31, 2019, in the Korean Intellectual Property Office, the present disclosure of which is incorporated herein in its entirety by reference.

BACKGROUND

1. Field

Aspects of one or more embodiments relate to a display device.

2. Description of the Related Art

Recently, the intended purpose and use of display devices has become more diversified. Also, as display devices have become thinner and more lightweight, their range of use has gradually expanded.

As an area occupied by a display area of a display device increases, functions that may be combined or associated with a display device may be added. As a way of adding various functions while increasing the display area, research is being conducted into a display device in which a portion of a display area is used for functions other than a function of displaying images.

The above information disclosed in this Background section is only for enhancement of understanding of the background and therefore the information discussed in this Background section does not necessarily constitute prior art.

SUMMARY

Aspects of one or more example embodiments include a structure around at least one first area arranged inside a display area.

Additional aspects will be set forth in part in the description which follows and, in part, will be more apparent from the description, or may be learned by practice of the presented embodiments.

According to one or more example embodiments, a display device includes: a substrate including an opening and a display area surrounding the opening; a plurality of display elements in the display area and including a first display element and a second display element spaced apart from each other about the opening; an input sensing layer on the plurality of display elements and including two first sensing electrodes spaced apart from each other around the opening and two second sensing electrodes spaced apart from each other around the opening; and a plurality of segments arranged between the opening and the display area, wherein the plurality of segments include: a first segment electrically connected to one of the two first sensing electrodes through a first line; and a second segment electrically connected to the first segment through a second line.

According to some example embodiments, an end of the first line and an end of the second line may be spaced apart from each other in at least one of a width direction or a lengthwise direction of the first segment.

According to some example embodiments, the display device may further include: an insulating layer between the first line and the first segment and between the second line and the first segment, wherein the first segment may be connected to the first line through a first contact hole in the insulating layer and may be connected to the second line through a second contact hole in the insulating layer.

According to some example embodiments, the first contact hole and the second contact hole may be spaced apart from each other.

According to some example embodiments, the first segment may include an inner edge adjacent to the opening and an outer edge opposite to the inner edge, wherein the first contact hole may be arranged adjacent to the outer edge of the first segment and the second contact hole may be arranged adjacent to the inner edge of the first segment.

According to some example embodiments, the first contact hole and the second contact hole may be arranged along a line in a radial direction from a center of the opening and may be spaced apart from each other along the line.

According to some example embodiments, the first contact hole and the second contact hole may be spaced apart from each other in a circumferential direction surrounding the opening.

According to some example embodiments, a length (or a diameter) of the first contact hole may be greater than one half of a width of the first segment, in a plan view.

According to some example embodiments, the second segment may be electrically connected to the other of the two first sensing electrodes through a third line.

According to some example embodiments, the display device may further include: an insulating layer between the second line and the second segment and between the third line and the second segment, wherein the second segment may be connected to the second line through a third contact hole in the insulating layer and may be connected to the third line through a fourth contact hole in the insulating layer.

According to some example embodiments, the third contact hole and the fourth contact hole may be spaced apart from each other.

According to some example embodiments, the plurality of segments may include the same material as the first sensing electrodes or the second sensing electrodes.

According to some example embodiments, the plurality of segments may be spaced apart from each other in a circumferential direction surrounding the opening.

According to some example embodiments, the plurality of segments may include: a third segment located between the first segment and the second segment.

According to some example embodiments, the third segment may be electrically connected to any one of the two second sensing electrodes.

According to some example embodiments, the third segment may be spaced apart from the second line when viewed in a direction perpendicular to an upper surface of the substrate.

According to some example embodiments, a width of the third segment may be less than a width of the first segment.

According to one or more example embodiments, a display device includes: a substrate including a first area, a second area surrounding the first area, and a third area between the first area and the second area; a plurality of display elements in the second area; a plurality of sensing electrodes on the plurality of display elements; a plurality of segments in the third area and spaced apart from each other in a circumferential direction surrounding the first area; a first line connected to a first segment of the plurality of segments; and a second line connected to the first segment and spaced apart from the first line.

According to some example embodiments, the display device may further include: an insulating layer between the first line and the first segment and between the second line and the first segment, wherein the first line and the first segment may be connected to each other through a first contact hole in the insulating layer and the second line and the first segment may be connected to each other through a second contact hole in the insulating layer.

According to some example embodiments, the first contact hole and the second contact hole may be spaced apart from each other in at least one of a width direction or a lengthwise direction of the first segment.

According to some example embodiments, the first segment may include an inner edge adjacent to the first area and an outer edge opposite to the inner edge, wherein the first contact hole may be arranged adjacent to the outer edge of the first segment and the second contact hole may be arranged adjacent to the inner edge of the first segment.

According to some example embodiments, the first contact hole and the second contact hole may be aligned along a line in a radial direction from a center of the first area and may be spaced apart from each other along the line.

According to some example embodiments, the first contact hole and the second contact hole may be spaced apart from each other in a circumferential direction surrounding the first area.

According to some example embodiments, the first line may extend along a width of the first segment and a length of the first contact hole may be greater than one half of the width of the first segment in a plan view.

According to some example embodiments, the plurality of sensing electrodes may include: two first sensing electrodes spaced apart from each other with the first area between the two first sensing electrodes; and two second sensing electrodes spaced apart from each other with the first area between the two second sensing electrode.

According to some example embodiments, the first line may be connected to one of the two first sensing electrodes, and the second line may be connected to a second segment included in the plurality of segments.

According to some example embodiments, the second segment may be electrically connected to the other of the two first sensing electrodes.

According to some example embodiments, the display device may further include: a third line spaced apart from the second line and connected to the second segment, and an insulating layer between the second line and the second segment and between the third line and the second segment, wherein the second line and the second segment may be connected to each other through a third contact hole in the insulating layer and the third line and the second segment may be connected to each other through a fourth contact hole in the insulating layer.

According to some example embodiments, the third contact hole and the fourth contact hole may be spaced apart from each other in at least one of a width direction or a depth direction of the second segment.

According to some example embodiments, the plurality of segments may further include a third segment, wherein the third segment may be electrically connected to one of the two second sensing electrodes through a third line intersecting the first line.

According to some example embodiments, one of the two second sensing electrodes, the third line, and the third segment may be located on the same layer.

According to some example embodiments, the third segment may be arranged adjacent to the first segment and the second line may extend along an edge of the third segment and may be spaced apart from the third segment when viewed in a direction perpendicular to an upper surface of the substrate.

According to some example embodiments, a width of the third segment may be less than a width of the first segment.

According to some example embodiments, the plurality of segments may further include a fourth segment located opposite to the third segment with the first segment between the third segment and the fourth segment, wherein the fourth segment may be electrically connected to the other of the two second sensing electrodes, electrically connected to the third segment through a fourth line.

According to some example embodiments, the fourth line may overlap the first line.

Other aspects, features, and characteristics of some example embodiments other than those described above will become more apparent from the following drawings, claims, and detailed description of the disclosure.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
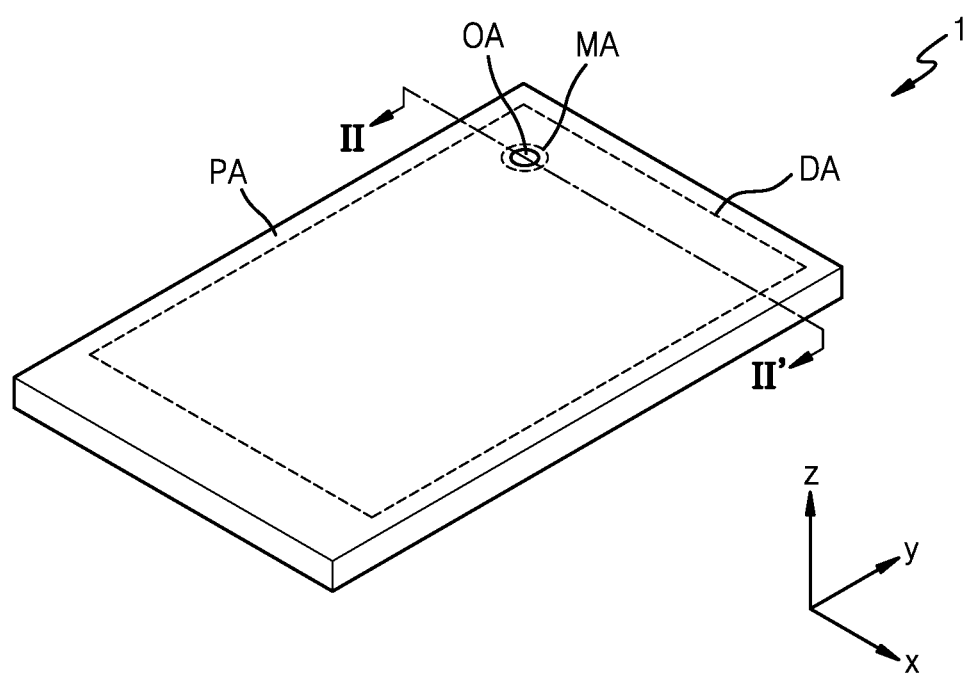
FIG. 1 is a perspective view of a display device according to some example embodiments.

Reference will now be made in more detail to example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the disclosure will be described in more detail by explaining the example embodiments of the disclosure with reference to the attached drawings, and like reference numerals in the drawings denote like elements and thus their description will be omitted.

It will be understood that although the terms "first", "second", etc. may be used herein to describe various components, these components should not be limited by these terms and are only used to distinguish one component from another.

As used herein, the singular forms "a," "an" and "the" are intended to include the plural forms as well, unless the context clearly indicates otherwise.

It will be further understood that the terms "includes" and/or "including" used herein specify the presence of stated features or components, but do not preclude the presence or addition of one or more other features or components.

It will be understood that when a layer, region, or component is referred to as being "formed on," another layer, region, or component, it may be directly or indirectly formed on the other layer, region, or component. That is, for example, intervening layers, regions, or components may be present.

Sizes of elements in the drawings may be exaggerated or reduced for convenience of description. In other words, because sizes and thicknesses of components in the drawings are arbitrarily illustrated for convenience of description, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with another layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

In the present specification, "A and/or B" denotes A, B, or A and B.

FIG. 1 is a perspective view of a display device 1 according to some example embodiments.

Referring to FIG. 1, the display device 1 includes a first area OA and a second area DA (hereinafter, referred to as a display area DA), which is a display area at least partially surrounding the first area OA. The display device 1 may provide or display an image by using light emitted from a plurality of pixels arranged in the display area DA. According to some example embodiments, as shown in FIG. 1, one first area OA may be arranged inside the display area DA. According to some example embodiments, the number of first areas OA may be two or more. According to some example embodiments, the first area OA may be entirely surrounded by the display area DA.

A third area MA (hereinafter, referred to as a middle area MA), which is a middle area, may be arranged between the first area OA and the display area DA, which is the second area. The display area DA may be surrounded by a fourth area PA (hereinafter, referred to as an peripheral area PA), which is a peripheral area around or outside a footprint of the display area DA. The middle area MA and the peripheral area PA may each be a kind of non-display area in which pixels are not arranged. The middle area MA may be entirely surrounded by the display area DA, and the display area DA may be entirely surrounded by the peripheral area PA.

Although an organic light-emitting display device is described below as an example of the display device 1 according to some example embodiments, the display device 1 is not limited thereto. According to some example embodiments, various types of display devices such as a liquid crystal display, an inorganic light-emitting display, and a quantum dot light-emitting display may be used.

Although it is shown in FIG. 1 that the first area OA is approximately circular, embodiments according to the present disclosure are not limited thereto. In a plan view (or when viewed from a direction perpendicular to a main or planar surface of a substrate), a shape of each of the first areas OA may be a circular shape, an elliptical shape, a polygonal shape, a star shape, or a diamond shape and may be variously modified.

Figure 2:
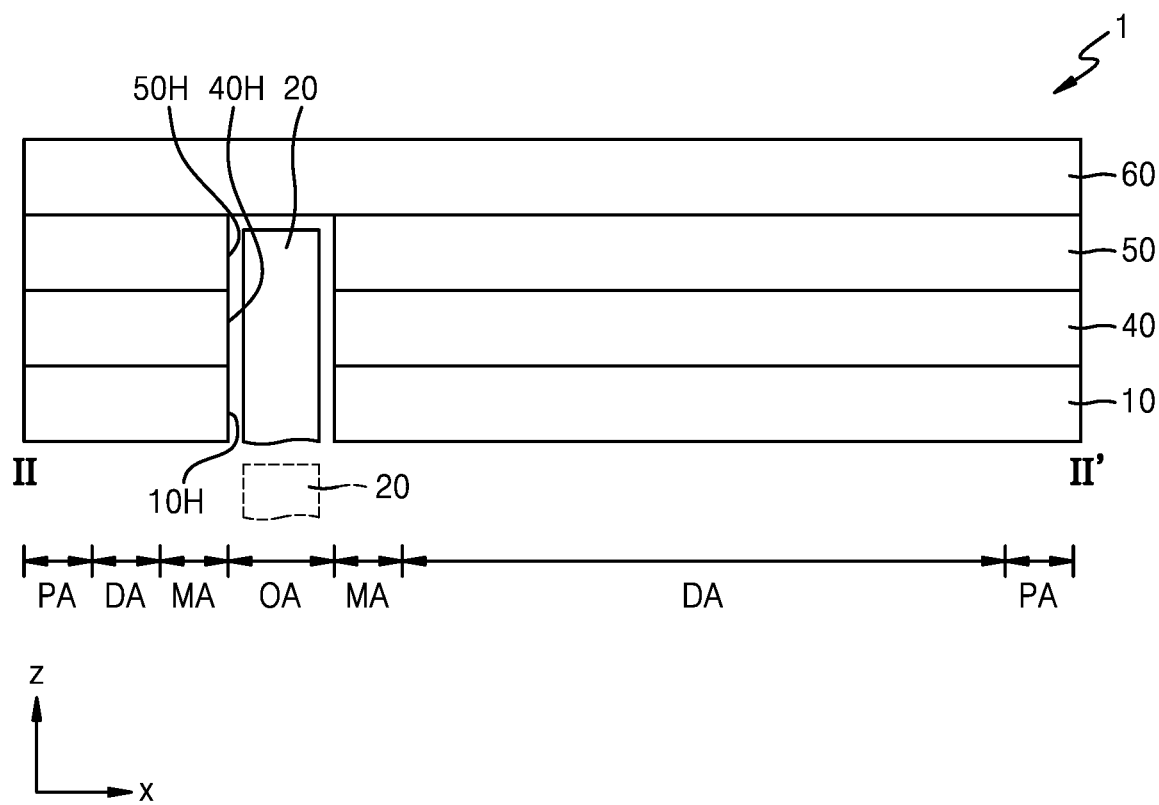
FIG. 2 is a cross-sectional view of a display device according to some example embodiments.

FIG. 2 is a cross-sectional view of the display device 1 according to some example embodiments, taken along the line II-II' of FIG. 1.

Referring to FIG. 2, the display device 1 may include a display panel 10, an input sensing layer 40 on the display panel 10, and an optical functional layer 50, which may be covered by a window 60. The display device 1 may include various electronic devices such as mobile phones, notebook computers, and smartwatches.

The display panel 10 may display an image. The display panel 10 includes pixels arranged in the display area DA. Each of the pixels may include a display element and a pixel circuit connected thereto. The display element may include an organic light-emitting diode. Alternatively, the display element may include an inorganic light-emitting diode or a quantum dot light-emitting diode.

The input sensing layer 40 obtains coordinate information corresponding to an external input, for example, a touch event. The input sensing layer 40 may include a sensing electrode (or a touch electrode) and trace lines connected to the sensing electrode. The input sensing layer 40 may be located on the display panel 10. The input sensing layer 40 may sense an external input using a mutual cap method and/or a self cap method.

The input sensing layer 40 may be directly formed on the display panel 10 or may be formed separately and then coupled to the display panel 10 by using an adhesive layer such as an optical clear adhesive (OCA). For example, the input sensing layer 40 may be successively formed after a process of forming the display panel 10. In this case, the adhesive layer may not be arranged between the input sensing layer 40 and the display panel 10. Although FIG. 2 shows that the input sensing layer 40 is arranged between the display panel 10 and the optical functional layer 50, the input sensing layer 40 may be arranged on the optical functional layer 50 according to some example embodiments.

The optical functional layer 50 may include a reflection prevention layer. The reflection prevention layer may reduce reflectivity of light (external light) incident from the outside toward the display panel 10 through the window 60. The reflection prevention layer may include a retarder and a polarizer. The retarder may be of a film type or a liquid crystal coating type and may include a λ/2 retarder and/or a λ/4 retarder. The polarizer may also be of a film type or a liquid crystal coating type. A film-type polarizer may include a stretchable synthetic resin film, and a liquid crystal coating-type polarizer may include liquid crystals arranged in an arrangement (e.g., a set or predetermined arrangement).

According to some example embodiments, the reflection prevention layer may include a black matrix and color filters. The color filters may be arranged by taking into account colors of light emitted respectively from pixels of the display panel 10. According to some example embodiments, the reflection prevention layer may include a destructive interference structure. The destructive interference structure may include a first reflection layer and a second reflection layer respectively arranged in different layers. First reflected light and second reflected light respectively reflected by the first reflection layer and the second reflection layer may create destructive-interference and thus the reflectivity of external light may be reduced.

The optical functional layer 50 may include a lens layer. The lens layer may improve the emission efficiency of light emitted from the display panel 10 or reduce the color deviation of light. The lens layer may include a layer having a concave or convex lens shape and/or include a plurality of layers respectively having different refractive indexes. The optical functional layer 50 may include both the reflection prevention layer and the lens layer or include one of the reflection prevention layer and the lens layer.

Each of the display panel 10, the input sensing layer 40, and the optical functional layer 50 may include an opening. With regard to this, FIG. 2 shows that the display panel 10, the input sensing layer 40, and the optical functional layer 50 respectively include first to third openings 10H, 40H, and 50H and that the first to third openings 10H, 40H, and 50H thereof overlap each other. The first opening 10H may penetrate from the top surface of the display panel 10 to the bottom surface of the display panel 10, the second opening 40H may penetrate from the top surface of the input sensing layer 40 to the bottom surface of the input sensing layer 40, and the third opening 50H may penetrate from the top surface of the optical functional layer 50 to the bottom surface of the optical functional layer 50.

The first to third openings 10H, 40H, and 50H may be located to overlap each other in the first area OA. The first area OA may be an area, in which one or more of the first to third openings 10H, 40H, and 50H are arranged, and may be a kind of opening area. Sizes (or diameters) of the first to third openings 10H, 40H, and 50H may be the same or different from each other.

According to some example embodiments, at least one of the display panel 10, the input sensing layer 40, or the optical functional layer 50 may not include an opening. For example, one or two of the display panel 10, the input sensing layer 40, and the optical functional layer 50 may not include an opening.

The first area OA may be a kind of component area (e.g., a sensor area, a camera area, a speaker area, etc.) in which a component 20 for adding various functions to the display device 1 is located. As shown by a solid line in FIG. 2, the component 20 may be located in the first to third openings 10H, 40H, and 50H. Alternatively, as shown by a dashed line in FIG. 2, the component 20 may be located under the display panel 10. When the display panel 10 does not include the first opening 10H, the component 20 may be located under the display panel 10, as shown by a dashed line in FIG. 2. In other words, according to some example embodiments, the component 20 may be embedded within or coplanar with various layers (e.g., the optical functional layer 50, the input sensing layer 40, and the display panel) of the display device 1, or the component 20 positioned below various layers (e.g., below the display panel 10), according to the design of the display device 1.

The component 20 may include an electronic element. For example, the component 20 may include an electronic element that uses light or sound. For example, an electronic element may be a sensor such as an infrared sensor that emits and/or receives light, a camera that receives light and captures an image, a sensor that outputs and senses light or sound to measure a distance or recognize a fingerprint, a small lamp that outputs light, or a speaker that outputs sound. An electronic element that uses light may use light in various wavelength bands such as visible light, infrared light, and ultraviolet light. Thus, according to some example embodiments, the component 20 may be an electrical component configured to transmit or receive a signal utilizing, for example, radio wave, visual or non-visual spectrum waves, or sound, according to the design of the display device 1. According to some example embodiments, the component 20 may be an electrical component configured to transmit or receive a signal utilizing, for example, audible wave which humans can hear or inaudiable wave such as ultrasonic wave. According to some example embodiments, the first area OA may be a transmission area through which light and/or sound, which are output from the component 20 to the outside or propagate toward the electronic element from the outside, may pass.

According to some example embodiments, in the case where the display device 1 is used as a smartwatch or an instrument panel for an automobile, the component 20 may be a member including a needle of a clock or a needle, etc. indicating predetermined information (e.g., the velocity of a vehicle, etc.). In the case where the display device 1 includes the component 20 such as a needle of a clock or an instrument panel for an automobile, the component 20 may be exposed to the outside through the window 60, which may include an opening corresponding to the first area OA. Alternatively, even in the case where the display device 1 includes the component 20 such as a speaker, the window 60 may include an opening corresponding to the first area OA.

As described above, the component 20 may include element(s) related to a function of the display panel 10 or an element such as an accessory that increases an esthetic sense of the display panel 10. According to some example embodiments, a layer including an OCA, etc. may be located between the window 60 and the optical functional layer 50.

Figure 3:
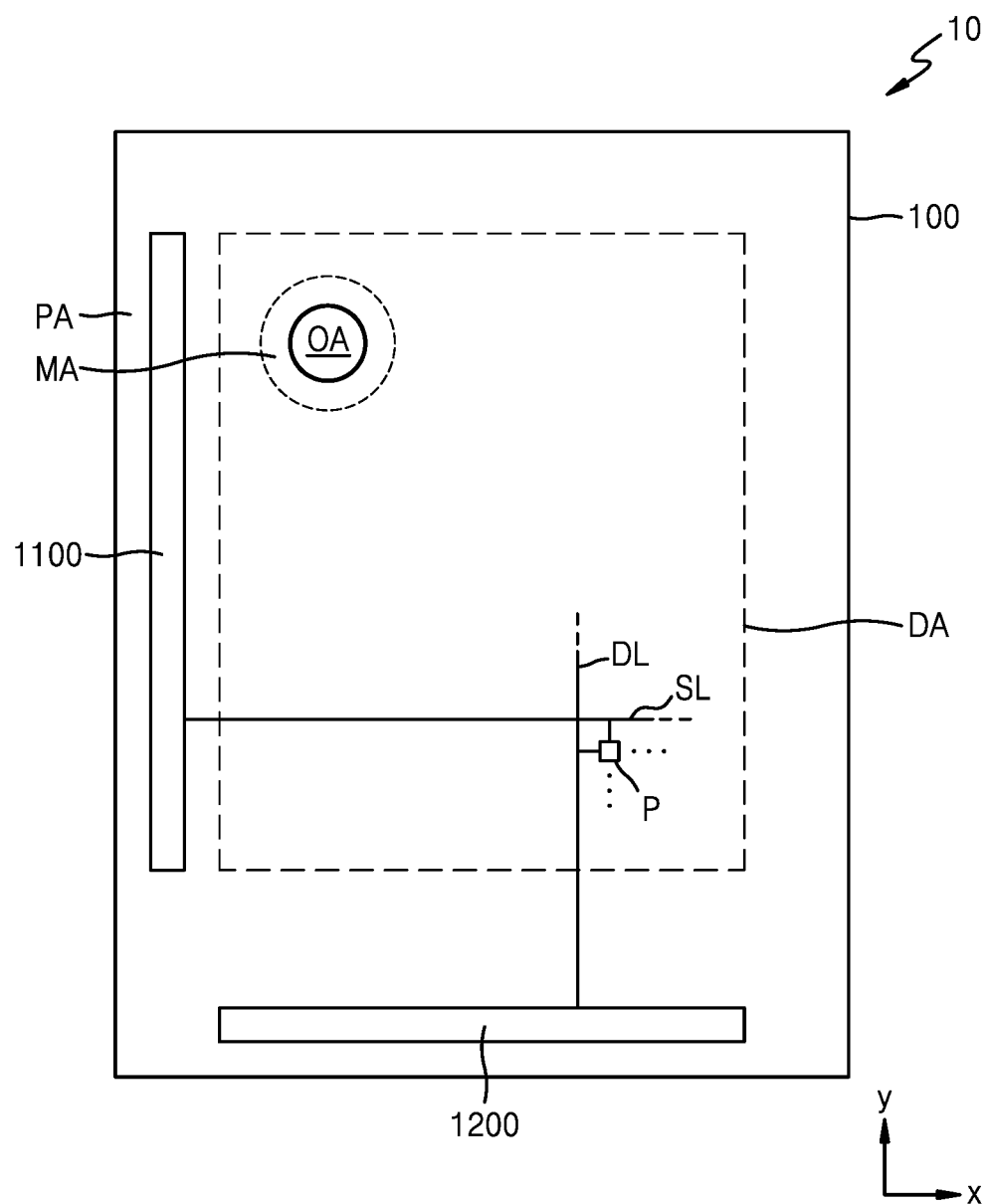
FIG. 3 is a plan view of a display panel according to some example embodiments.
Figure 4:
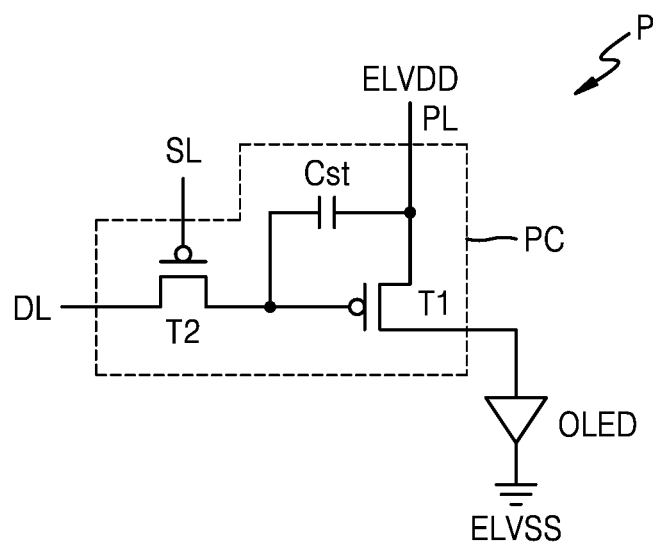
FIG. 4 is an equivalent circuit diagram of one pixel of a display panel.

FIG. 3 is a plan view of the display panel 10 according to some example embodiments, and FIG. 4 is an equivalent circuit diagram of one of the pixels of the display panel 10.

Referring to FIG. 3, the display panel 10 includes the first area OA, the display area DA, which is the second area, the middle area MA, which is the third area, and the peripheral area PA, which is the fourth area. FIG. 3 may be a figure of a substrate 100 of the display panel 10. For example, the substrate 100 may include the first area OA, the display area DA, the middle area MA, and the peripheral area PA. Although it is shown in FIG. 3 that the first area OA is arranged on the upper left side of the display area DA, embodiments according to the present disclosure are not limited thereto. When the first area OA is arranged inside the display area DA, the specific position of the first area OA may be variously changed. For example, the first area OA may be located at the center of the upper side of the display area DA, at the center of the display area DA, or at the upper right side of the display area DA.

The display panel 10 includes a plurality of pixels P arranged in the display area DA. As shown in FIG. 4, each pixel P includes a pixel circuit PC and an organic light-emitting diode OLED as a display element connected to the pixel circuit PC. The pixel circuit PC may include a first thin film transistor T1, a second thin film transistor T2, and a storage capacitor Cst. Each pixel P may emit, for example, red, green, or blue light, or red, green, blue, or white light through the organic light-emitting diode OLED.

The second thin film transistor T2 is a switching thin film transistor and is connected to a scan line SL and a data line DL, and may transfer a data voltage input from the data line DL to the first thin film transistor T1 in response to a switching voltage input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied from the driving voltage line PL.

The first thin film transistor T1 is a driving thin film transistor and may be connected to the driving voltage line PL and the storage capacitor Cst and may control a driving current flowing through the organic light-emitting diode OLED from the driving voltage line PL in response to the voltage value stored in the storage capacitor Cst. The organic light-emitting diode OLED may emit light having predetermined brightness by using the driving current. An opposite electrode (e.g. a cathode) of the organic light-emitting diode OLED may receive a second power voltage ELVSS.

Although it is shown in FIG. 4 that the pixel circuit PC includes two thin film transistors and one storage capacitor, embodiments according to the present disclosure are not limited thereto. The number of thin film transistors and the number of storage capacitors may be variously modified depending on a design of the pixel circuit PC.

Referring to FIG. 3 again, the middle area MA may surround the first area OA. The middle area MA is an area in which a display element such as the organic light-emitting diode OLED is not arranged. Signal lines configured to provide a signal to pixels P arranged around the first area OA may pass across the middle area MA. A scan driver 1100 configured to provide a scan signal to each pixel P, a data driver 1200 configured to provide a data signal to each pixel P, and a first main power wiring and a second main power wiring configured to provide a first power voltage ELVDD (see FIG. 4) and a second power voltage ELVSS (see FIG. 4), respectively, may be located in the peripheral area PA. Although it is shown in FIG. 3 that the data driver 1200 is adjacent to one side of the substrate 100, the data driver 1200 may be located on a flexible printed circuit board (FPCB) electrically connected to a pad arranged on one side of the display panel 10 according to some example embodiments. Additionally, although only a single pixel P, a single scan line SL, and a single data line DL are illustrated in FIG. 3, embodiments according to the present disclosure may include a plurality of pixels P, a plurality of scan lines SL, and a plurality of data lines DL, according to the design and size of the display panel 10.

Figure 5:
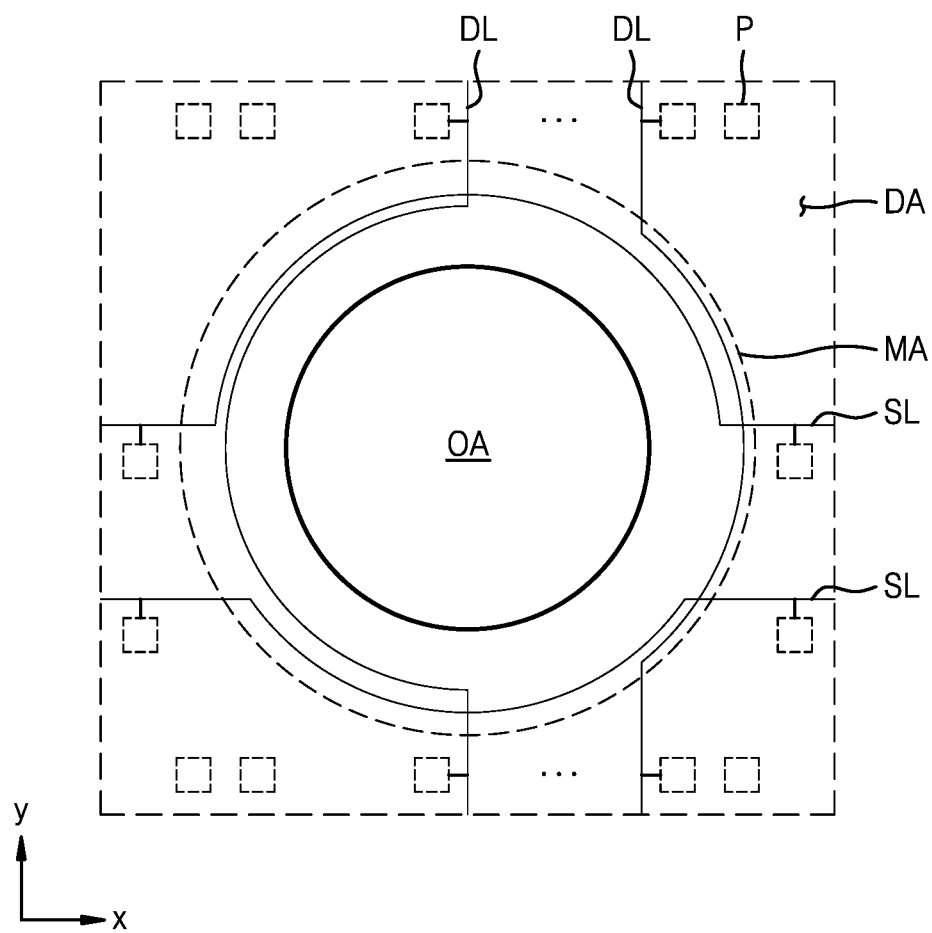
FIG. 5 is a plan view of a portion of a display panel according to some example embodiments.

FIG. 5 is a plan view of a portion of the display panel 10 according to some example embodiments and shows signal lines located in a middle area.

Referring to FIG. 5, pixels P may be arranged in the display area DA, and the middle area MA may be arranged between the first area OA and the display area DA. Pixels P adjacent to the first area OA may be spaced apart from each other around the first area OA. As shown in the plan view of FIG. 5, the pixels P may be spaced apart up and down around the first area OA, or spaced apart left and right around the first area OA.

Signal lines adjacent to the first area OA among the signal lines configured to supply a signal to the pixels P may detour around the first area OA. Some of the data lines DL that pass across the display area DA may extend in a y-direction so as to provide a data signal to the pixels P arranged up and down with the first area OA therebetween, and detour along an edge of the first area OA in the middle area MA. Some of the scan lines SL that pass across the display area DA may extend in an x-direction so as to provide a scan signal to the pixels P arranged left and right with the first area OA therebetween, and detour along an edge of the first area OA in the middle area MA.

Although FIG. 5 shows that the scan lines SL detour around the first area OA in the middle area MA, embodiments according to the present disclosure are not limited thereto. According to some example embodiments, the scan lines SL may be separated or disconnected around the first area OA. The scan lines SL arranged on the left side around the first area OA may receive a signal from the scan driver 1100 arranged on the left side around the display area DA, as shown in FIG. 3, and the scan lines SL arranged on the right side around the first area OA may receive a signal from an additional scan driver arranged on the opposite side of the scan driver 1100 around the display area DA, according to some example embodiments.

Figure 6:
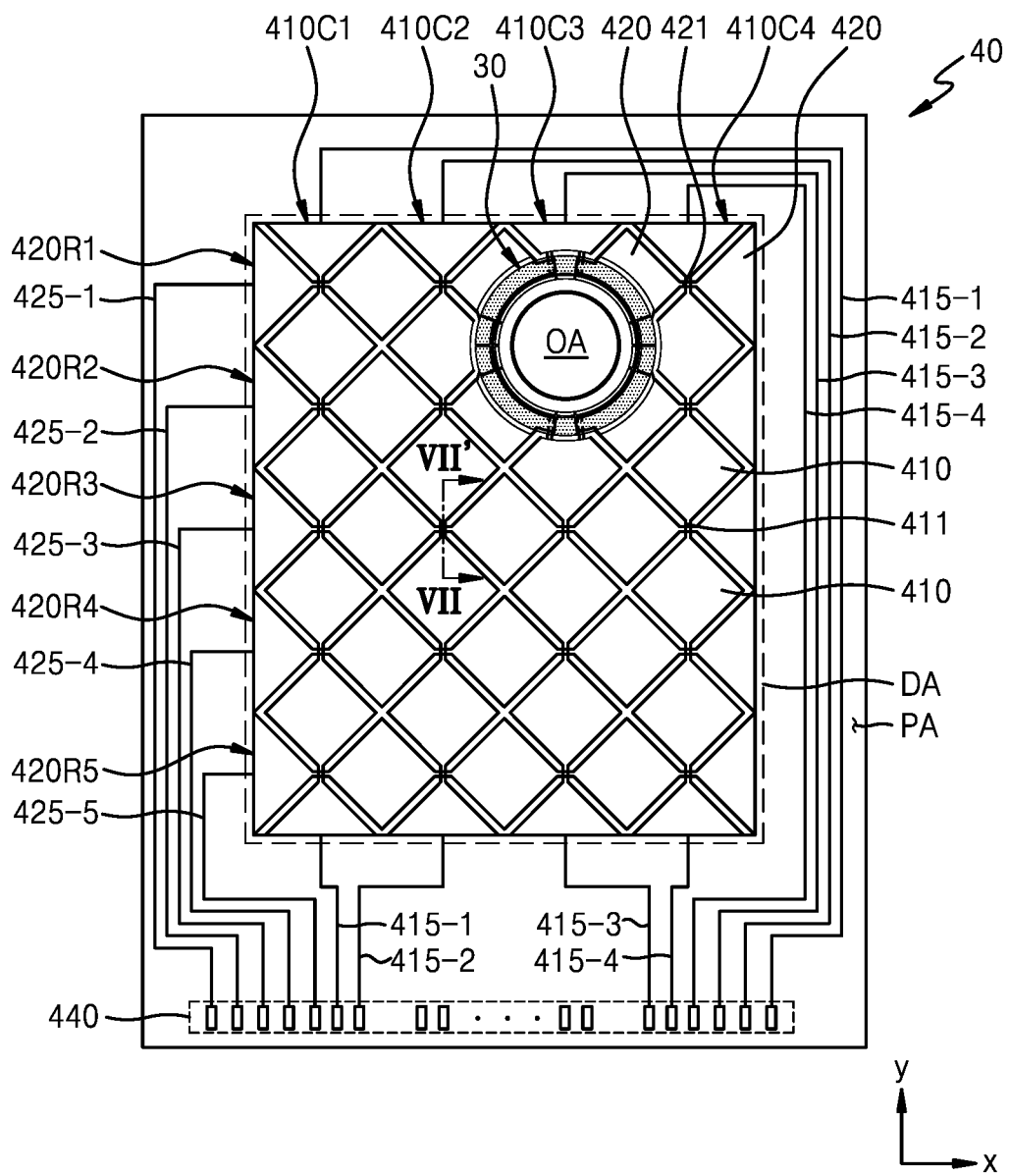
FIG. 6 is a plan view of an input sensing layer on a display panel according to some example embodiments.
Figure 7:
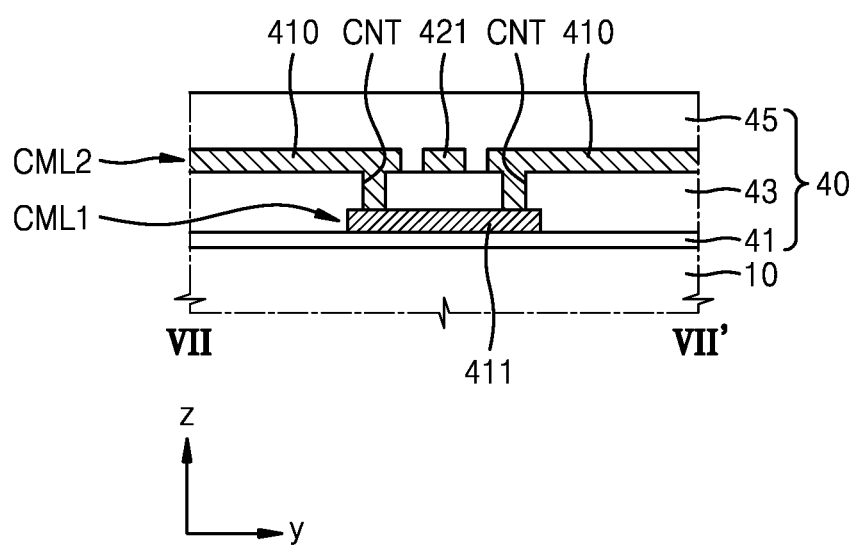
FIG. 7 is a cross-sectional view taken along a line VII-VII' of FIG. 6.
Figure 8A:
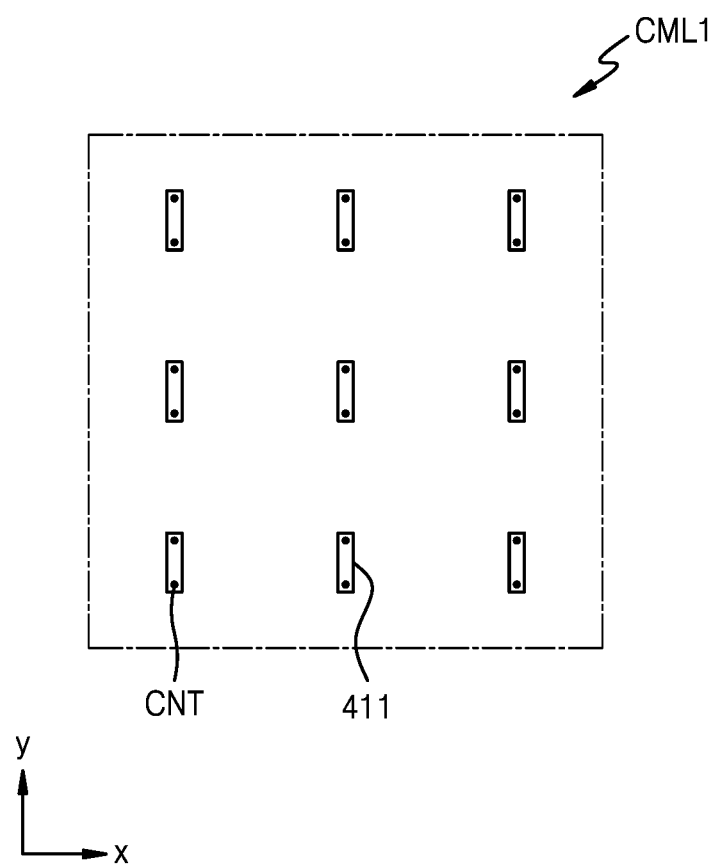
FIG. 8A is a plan view of a first conductive layer of FIG. 7.
Figure 8B:
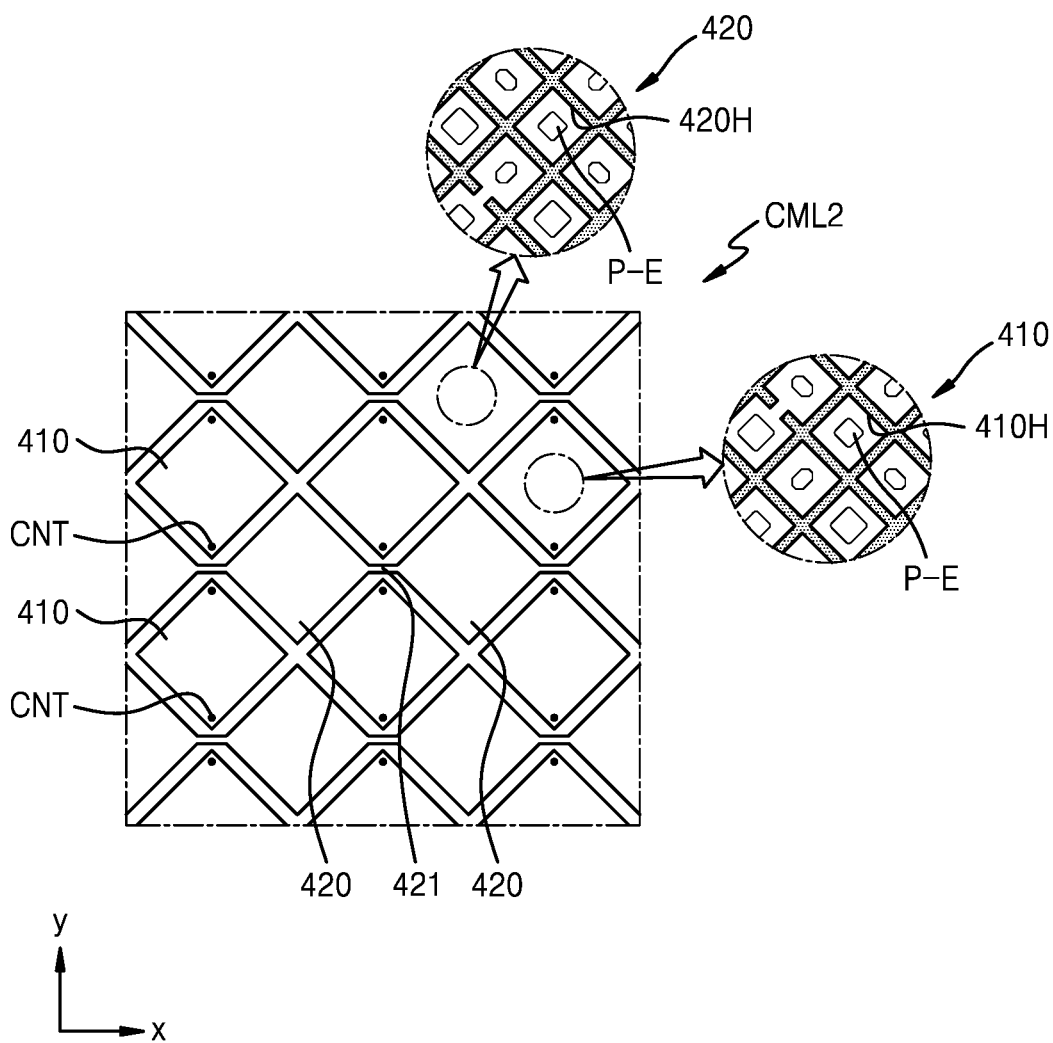
FIG. 8B is a plan view of a second conductive layer of FIG. 7.

FIG. 6 is a plan view of the input sensing layer 40 on the display panel 10 according to some example embodiments, FIG. 7 is a cross-sectional view of the input sensing layer 40 taken along the line VII-VII' of FIG. 6, FIG. 8A is a plan view of a first conductive layer CML1 of FIG. 7, and FIG. 8B is a plan view of a second conductive layer CML2 of FIG. 7.

Referring to FIG. 6, the input sensing layer 40 may include first sensing electrodes 410, first trace lines 415-1, 415-2, 415-3, and 415-4 connected to the first sensing electrodes 410, second sensing electrodes 420, and second trace lines 425-1, 425-2, 425-3, 425-4, and 425-5 connected to the second sensing electrodes 420.

The first sensing electrodes 410 may be arranged in the y-direction, and the second sensing electrodes 420 may be arranged in the x-direction that intersects with the y-direction. The first sensing electrodes 410 arranged in the y-direction may be connected to each other by a first connection electrode 411 between neighboring first sensing electrodes 410 and may constitute first sensing lines 410C1, 410C2, 410C3, and 410C4. The second sensing electrodes 420 arranged in the x-direction may be connected to each other by a second connection electrode 421 between neighboring second sensing electrodes 420 and may constitute second sensing lines 420R1, 420R2, 420R3, 420R4, and 420R5. The first sensing lines 410C1, 410C2, 410C3, and 410C4 and the second sensing lines 420R1, 420R2, 420R3, 420R4, and 420R5 may intersect each other. For example, the first sensing lines 410C1, 410C2, 410C3, and 410C4 and the second sensing lines 420R1, 420R2, 420R3, 420R4, and 420R5 may intersect each other at right angles.

The first sensing lines 410C1, 410C2, 410C3, and 410C4 and the second sensing lines 420R1, 420R2, 420R3, 420R4, and 420R5 may be arranged in the display area DA and connected to a sensing signal pad 440 through the first trace lines 415-1, 415-2, 415-3, and 415-4 and the second trace lines 425-1, 425-2, 425-3, 425-4, and 425-5 formed in the second non-display area NDA2. The first sensing lines 410C1, 410C2, 410C3, and 410C4 may be respectively connected to the first trace lines 415-1, 415-2, 415-3, and 415-4. The second sensing lines 420R1, 420R2, 420R3, 420R4, and 420R5 may be respectively connected to the second trace lines 425-1, 425-2, 425-3, 425-4, and 425-5.

FIG. 6 shows that the first trace lines 415-1, 415-2, 415-3, and 415-4 are respectively connected to the upper sides and the lower sides of the first sensing lines 410C1, 410C2, 410C3, and 410C4, and sensing sensitivity may be improved through this structure. However, embodiments according to the present disclosure are not limited thereto. According to some example embodiments, the first trace lines 415-1, 415-2, 415-3, and 415-4 may be connected to only the upper sides or the lower sides of the first sensing lines 410C1, 410C2, 410C3, and 410C4. The arrangement form of the first trace lines 415-1, 415-2, 415-3, and 415-4 and the second trace lines 425-1, 425-2, 425-3, 425-4, and 425-5 may be variously changed depending on the shape, size of the display area DA or a sensing method, etc. of the input sensing layer 40.

The input sensing layer 40 may include a plurality of conductive layers. Referring to FIG. 7, the input sensing layer 40 may include the first conductive layer CML1 and the second conductive layer CML2 arranged over the display panel 10. A first insulating layer 41 may be arranged between the first conductive layer CML1 and the display panel 10, a second insulating layer 43 may be arranged between the first conductive layer CML1 and the second conductive layer CML2, and a third insulating layer 45 may be arranged on the second conductive layer CML2. According to some example embodiments, each of the first and second insulating layers 41 and 43 may include an inorganic insulating layer including silicon oxide, silicon oxynitride, or silicon nitride, and the third insulating layer 45 may include an organic insulating layer.

As shown in FIGS. 7 and 8A, the first conductive layer CML1 may include the first connection electrodes 411. As shown in FIGS. 7 and 8B, the second conductive layer CML2 may include the first sensing electrodes 410, the second sensing electrodes 420, and the second connection electrodes 421. The second sensing electrodes 420 may be connected to each other by the second connection electrodes 421 formed in the same layer as the second sensing electrodes 420. The first sensing electrodes 410 may be connected to each other by the first connection electrodes 411 formed in a layer different from that of the first sensing electrodes 410. The first connection electrodes 411 may be connected to the neighboring first sensing electrodes 410 through a contact hole CNT formed in the second insulating layer 43.

Each of the first and second conductive layers CML1 and CML2 may include metal. For example, each of the first and second conductive layers CML1 and CML2 may include Mo, Al, Cu, and/or Ti and may include a single layer or multiple layers including the above-mentioned one or more materials. According to some example embodiments, each of the first and second conductive layers CML1 and CML2 may have a multi-layer structure in which a Ti layer, an Al layer, and a Ti layer are sequentially stacked.

Referring to an enlarged view of FIG. 8B, the first sensing electrode 410 may have a mesh structure (or a grid structure, a lattice structure) including a plurality of holes 410H. Each of the holes 410H may overlap an emission area P-E of a pixel. Portions of the first sensing electrode 410 are connected to each other so as to have a mesh structure and may define the holes 410H. The holes 410H may be spatially separated with the portions of the first sensing electrode 410 therebetween. Some neighboring holes 410H of the plurality of holes 410H may be spatially connected to each other.

Similarly, the second sensing electrode 420 may have a grid structure (or a lattice structure) including a plurality of holes 420H. Each of the holes 420H may overlap an emission area P-E of a pixel. Portions of the second sensing electrode 420 are connected to each other so as to have a mesh structure and may define the holes 420H. The holes 420H may be spatially separated with the portions of the second sensing electrode 420 therebetween. Some neighboring holes 420H of the plurality of holes 420H may be spatially connected to each other.

Although it is described with reference to FIGS. 7 to 8B that the first sensing electrodes 410 and the first connection electrodes 411 are arranged on different layers, embodiments according to the present disclosure are not limited thereto. According to some example embodiments, the first sensing electrodes 410 and the first connection electrodes 411 may be arranged on the same layer (e.g., the first conductive layer or the second conductive layer), and the second sensing electrodes 420 and the second connection electrodes 421 may be arranged on different layers and connected through a contact hole that passes through the second insulating layer 43.

Although it is described with reference to FIGS. 7 to 8B that the first and second sensing electrodes 410 and 420 are included in the second conductive layer CML2, embodiments according to the present disclosure are not limited thereto. According to some example embodiments, the first sensing electrodes 410 and the second sensing electrodes 420 may be arranged on different layers. For example, one of the first conductive layer CML1 and the second conductive layer CML2 may include the first sensing electrodes 410, and the other may include the second sensing electrodes 420.

Referring again to FIG. 6, a conductive layer 30 including a plurality of segments arranged in a circumferential direction surrounding the first area OA may be arranged around the first area OA. The conductive layer 30 may be simultaneously formed during a process of forming one of the first conductive layer CML1 and the second conductive layer CML2, described above with reference to FIG. 7. For example, the conductive layer 30 may be formed during a process of forming the second conductive layer CML2, and in this case, the conductive layer 30 may be located on the same layer on which the first sensing electrode 410, the second sensing electrode 420, and/or the second connection electrode 421 are arranged and may include the same material as that of the first sensing electrode 410, the second sensing electrode 420, and/or the second connection electrode 421. According to some example embodiments, the conductive layer 30 may be formed during a process of forming the first conductive layer CML1, and in this case, the conductive layer 30 may be located on the same layer on which the first connection electrode 411 is arranged and may include the same material as that of the first connection electrode 411.

Figure 9:
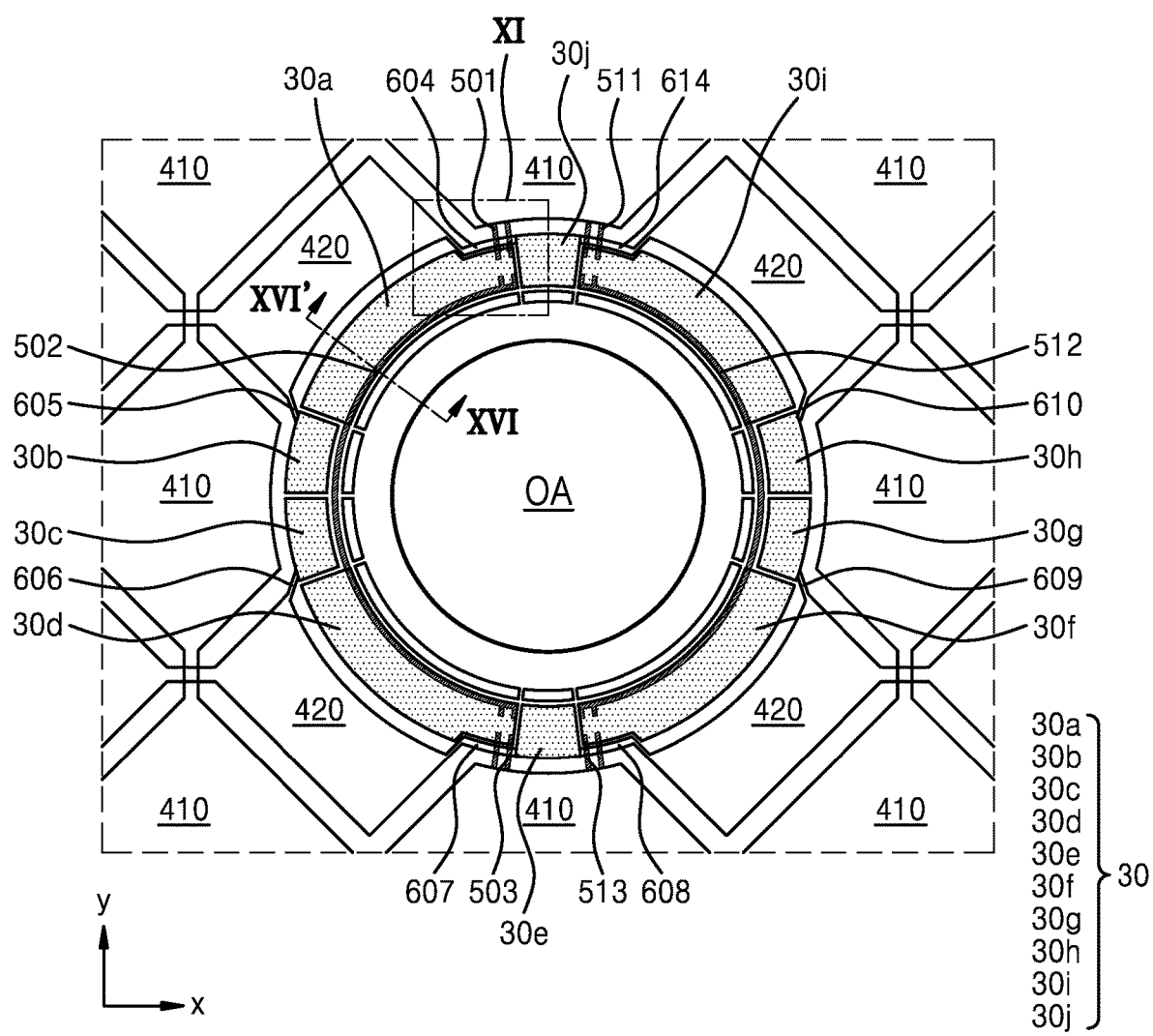
FIG. 9 is an enlarged plan view of an area around a first area in a display device according to some example embodiments.
Figure 10:
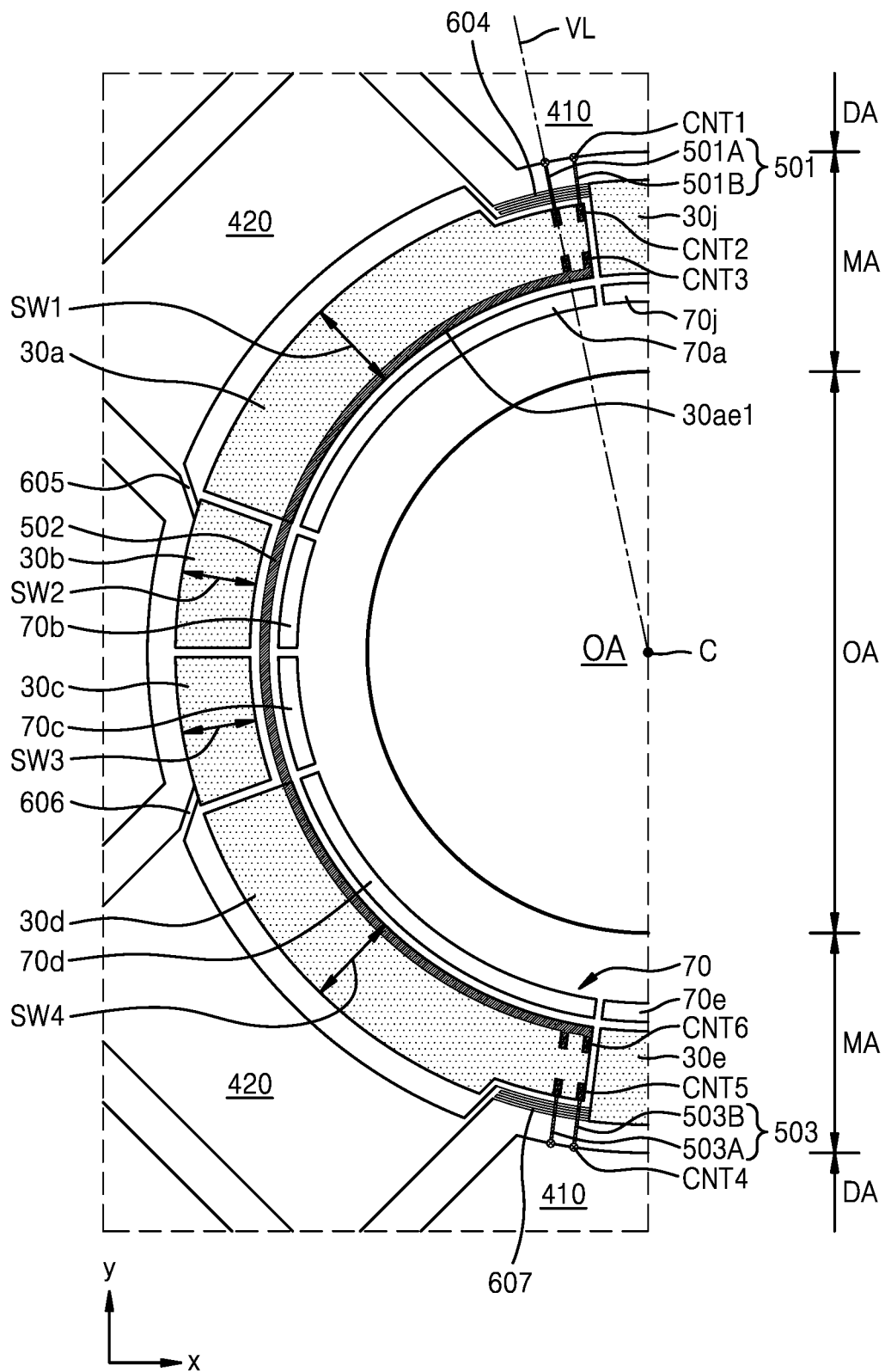
FIG. 10 is a plan view of the first area and an area around the first area in FIG. 9, according to some example embodiments.

FIG. 9 is an enlarged plan view of an area around the first area OA in the display device 1 according to some example embodiments, and FIG. 10 is a plan view of the first area OA and an area around the first area OA in FIG. 9, according to some example embodiments.

The conductive layer 30 may surround the first area OA. The conductive layer 30 may include a plurality of segments spaced apart from each other. According to some example embodiments, although FIG. 9 shows an example in which the conductive layer 30 includes first to tenth segments 30a, 30b, 30c, 30d, 30e, 30f, 30g, 30h, 30i, and 30j and the example in which the conductive layer 30 includes ten segments is mainly described below, embodiments according to the present disclosure are not limited thereto. The conductive layer 30 may include two or more segments, and the number thereof may be variously changed.

The first to tenth segments 30a, 30b, 30c, 30d, 30e, 30f, 30g, 30h, 30i, and 30j may be arranged in the circumferential direction of the first area OA. The first to tenth segments 30a, 30b, 30c, 30d, 30e, 30f, 30g, 30h, 30i, and 30j may be spaced apart from each other.

The first to tenth segments 30a, 30b, 30c, 30d, 30e, 30f, 30g, 30h, 30i, and 30j may be simultaneously formed during a process of forming the input sensing layer 40 described above with reference to FIG. 7. For example, the first to tenth segments 30a, 30b, 30c, 30d, 30e, 30f, 30g, 30h, 30i, and 30j may be formed in the same process as the first conductive layer CML1 or the second conductive layer CML2. Hereinafter, the case where the first to tenth segments 30a, 30b, 30c, 30d, 30e, 30f, 30g, 30h, 30i, and 30j are formed in the same layer as the second conductive layer CML2 and include the same material as that of the second conductive layer CML2.

At least one of the first to tenth segments 30a, 30b, 30c, 30d, 30e, 30f, 30g, 30h, 30i, or 30j may be electrically connected to at least one sensing electrode arranged around the first area OA. For example, the first segment 30a may be electrically connected to the first sensing electrode 410 arranged on the upper side of the first area OA through a first line 501. The second segment 30b may be electrically connected to the second sensing electrode 420 arranged on the upper left side of the first area OA through a fifth line 605. The third segment 30c may be electrically connected to the second sensing electrode 420 arranged on the lower left side of the first area OA through a sixth line 606. The fourth segment 30d may be electrically connected to the first sensing electrode 410 arranged on the lower side of the first area OA through a third line 503. The fifth segment 30e may be electrically connected to second sensing electrodes 420 respectively arranged on the lower left and lower right sides of the first area OA through a seventh line 607 and an eighth line 608. The sixth segment 30f may be electrically connected to the first sensing electrode 410 arranged on the lower side of the first area OA through a thirteenth line 513. The seventh segment 30g may be electrically connected to the second sensing electrode 420 arranged on the lower right side of the first area OA through a ninth line 609. The eighth segment 30h may be electrically connected to the second sensing electrode 420 arranged on the upper right side of the first area OA through a tenth line 610. The ninth segment 30i may be electrically connected to the first sensing electrode 410 arranged on the upper side of the first area OA through an eleventh line 511. The tenth segment 30j may be electrically connected to the second sensing electrodes 420 respectively arranged on the upper left and upper right sides of the first area OA through a fourth line 604 and a fourteenth line 614.

Each of the first to tenth segments 30a, 30b, 30c, 30d, 30e, 30f, 30g, 30h, 30i, and 30j may have a voltage level that is different from that of a sensing electrode adjacent thereto. For example, the first segment 30a is adjacent to the second sensing electrode 420 arranged on the upper left side of the first area OA in a radial direction away from the center of the first area OA, but may be electrically connected to the first sensing electrode 410 to thereby have the same voltage as that of the first sensing electrode 410. Similarly, the second segment 30b and the third segment 30c are adjacent to the first sensing electrode 410 arranged on the left side of the first area OA in the radial direction away from the center of the first area OA, but may be electrically connected to the second sensing electrodes 420 arranged on the upper left and lower left sides of the first area OA, respectively, to thereby have the same voltages as those of the corresponding second sensing electrodes 420, respectively. The fourth segment 30d is adjacent to the second sensing electrode 420 arranged on the lower left side of the first area OA in the radial direction away from the center of the first area OA, but may be electrically connected to the first sensing electrode 410 arranged on the lower side of the first area OA to thereby have the same voltage as that of the first sensing electrode 410. The fifth segment 30e is adjacent to the first sensing electrode 410 arranged on the lower side of the first area OA in the radial direction away from the center of the first area OA, but may be electrically connected to the second sensing electrodes 420 arranged on the lower left and lower right sides of the first area OA, respectively, to thereby have the same voltage as that of the second sensing electrodes 420. The sixth segment 30f is adjacent to the second sensing electrode 420 arranged on the lower right side of the first area OA in the radial direction away from the center of the first area OA, but may be electrically connected to the first sensing electrode 410 arranged on the lower side of the first area OA to thereby have the same voltage as that of the first sensing electrode 410. The seven segment 30g and the eight segment 30h are adjacent to the first sensing electrode 410 arranged on the right side of the first area OA in the radial direction away from the center of the first area OA, but may be electrically connected to the second sensing electrodes 420 arranged on the lower right and upper right sides of the first area OA, respectively, to thereby have the same voltages as those of the corresponding second sensing electrodes 420, respectively. The ninth segment 30i is adjacent to the second sensing electrode 420 arranged on the upper right side of the first area OA in the radial direction away from the center of the first area OA, but may be electrically connected to the first sensing electrode 410 arranged on the upper side of the first area OA to thereby have the same voltage as that of the first sensing electrode 410. The tenth segment 30j is adjacent to the first sensing electrode 410 arranged on the upper side of the first area OA in the radial direction away from the center of the first area OA, but may be electrically connected to the second sensing electrodes 420 arranged on the upper left and upper right sides of the first area OA, respectively, to thereby have the same voltage as that of the second sensing electrode 420.

Each of the first to tenth segments 30a, 30b, 30c, 30d, 30e, 30f, 30g, 30h, 30i, and 30j may have the same voltage level as that of the first sensing electrode 410 or the second sensing electrode 420 around the first area OA though the first to fourteenth lines 501, 502, 503, 604, 605, 606, 607, 608, 609, 610, 511, 512, 513, and 514, as described above, and thus may be understood as another sensing electrode.

Because each of the first to tenth segments 30a, 30b, 30c, 30d, 30e, 30f, 30g, 30h, 30i, and 30j functions as a sensing electrode (e.g., an auxiliary sensing electrode) although the first sensing electrode 410 and the second sensing electrode 420 around the first area OA have smaller areas than other first and second sensing electrodes 410 and 420 arranged in the display area, the sensing sensitivity around the first area OA may be improved. Although it is shown in FIG. 9 that two first sensing electrodes 410 and four second sensing electrodes 420 around the first area OA have areas that are smaller than the areas of the other sensing electrodes, embodiments according to the present disclosure are not limited thereto. The arrangement of the first sensing electrode 410 and the second sensing electrode 420 around the first area OA may be variously changed according to the position, shape, and/or size of the first area OA, and the areas of the first sensing electrode 410 and the second sensing electrode 420 may also be variously changed.

The first sensing electrodes 410 spaced apart from each other around the first area OA may be electrically connected through lines and segments. For example, the first sensing electrodes 410 arranged on the upper and lower sides of the first area OA may be electrically connected through electrical paths in which lines and segments are formed. According to some example embodiments, a structure in which the first line 501, the first segment 30a, the second line 502, the fourth segment 30d, and the third line 503 are connected may form an electrical path (hereinafter, referred to as a first path) for connecting the first sensing electrodes 410 arranged on the upper and lower sides of the first area OA. According to some example embodiments, a structure in which the eleventh line 511, the ninth segment 30i, the twelfth line 512, the sixth segment 30f, and the thirteenth line 513 are connected may form another electrical path (hereinafter, referred to as a second path) for connecting the first sensing electrodes 410 arranged on the upper and lower sides of the first area OA.

The second sensing electrodes 420 spaced apart from each other around the first area OA may be electrically connected through lines and segments. For example, the second sensing electrodes 420 arranged on the upper left and upper right sides of the first area OA may be electrically connected through the fourth line 604, the tenth segment 30j, and the fourteenth line 614. Similarly, the sensing electrodes 420 arranged on the lower left and lower right sides of the first area OA may be electrically connected through the seventh line 607, the fifth segment 30e, and the eighth line 608.

The first sensing electrodes 410, the second sensing electrodes 420, and the conductive layer 30 may be located on the same layer. For example, the first sensing electrodes 410, the second sensing electrodes 420, and the first to tenth segments 30a, 30b, 30c, 30d, 30e, 30f, 30g, 30h, 30i, and 30j may be provided in the second conductive layer CML2 described above with reference to FIG. 7.

Lines electrically connected to the first sensing electrodes 410 and lines electrically connected to the second sensing electrodes 420 may be located on different layers. For example, the first to third lines 501, 502, and 503 and the eleventh to thirteenth lines 511, 512, and 513 electrically connected to the first sensing electrodes 410 may be formed in the first conductive layer CML1 described with reference to FIG. 7, and the fourth to tenth lines 604, 605, 606, 607, 608, 609, and 610 and the fourteenth line 614 electrically connected to the second sensing electrodes 420 may be formed in the second conductive layer CML2 described with reference to FIG. 7.

The lines electrically connected to the first sensing electrodes 410 may intersect the lines electrically connected to the second sensing electrodes 420. As shown in FIGS. 9 and 10, the fourth line 604, which connects the second sensing electrode 420 arranged on the upper left side of the first area OA to the tenth segment 30j, may intersect the first line 501 which connects the first sensing electrode 410 located on the upper side of the first area OA to the first segment 30a. Similarly, the third line 503 may intersect the seventh line 607, the eighth line 608 may intersect the thirteenth line 513, and the fourteenth line 614 may intersect the eleventh line 511.

The first line 501 may include a plurality of sub-lines, as shown in FIG. 10. For example, the first line 501 may include a first sub-line 501A and a second sub-line 501B, and the first sub-line 501A and the second sub-line 501B may be spaced apart from each other and connect the first sensing electrode 410 to the first segment 30a.

A first end of the second line 502 may be connected to the first segment 30a via a third contact hole CNT3 and may extend in an arc direction that partially surrounds the periphery of the first area OA. A second end of the second line 502 may be connected to the fourth segment 30d via the sixth contact hole CNT6. A middle portion between the first end and the second end of the second line 502 may overlap the first segment 30a and the fourth segment 30d, connected to the second line 502. For example, the middle portion of the second line 502 may be adjacent to an inner edge 30ae1 of the first segment 30a and may overlap a portion of the first segment 30a, which includes the inner edge 30ae1. Likewise, the middle portion between the first end and the second end of the second line 502 may overlap a portion of the fourth segment 30d while being arranged adjacent to an inner edge of the fourth segment 30d.

The middle portion of the second line 502 may be spaced apart from a segment or segments arranged between segments that are respectively connected to the first end and the second end of the second line 502 on a plane (or in a direction perpendicular to the upper surface of the substrate). For example, the middle portion of the second line 502 may not overlap with the segment or the segments arranged between the segments that are respectively connected to the first end and the second end of the second line 502. For example, the middle portion of the second line 502 may not overlap segments between the first segment 30a and the fourth segment 30d, e.g., the second segment 30b and the third segment 30c. The second line 502 is electrically connected to the first sensing electrode 410 while each of the second and third segments 30b and 30c are electrically connected to the second sensing electrodes 420, and thus, the occurrence of parasitic capacitance that may occur when the second segment 30b and the third segment 30c overlap the second line 502 may be prevented through the above-described structure.

A width SW2 of the second segment 30b and a width SW3 of the third segment 30c may be less than a width SW1 of the first segment 30a and/or a width SW4 of the fourth segment 30d. According to some example embodiments, when the first segment 30a has a stepped plane shape in order to secure an area where the fourth line 604 is located, the width SW1 of the first segment 30a may be defined as a maximum width, for example, a width of a portion where no step is provided. Alternatively, when the edges of the first segment 30a have serpentine curves rather than gentle curves or straight lines, the width of the first segment 30a may be understood as an average value of a maximum width and a minimum width, and the definition for the width of the first segment 30a may be equally applied to other segments.

The third line 503 may include a plurality of sub-lines. For example, the third line 503 may include a third sub-line 503A and a fourth sub-line 503B, and the third sub-line 503A and the fourth sub-line 503B may be spaced apart from each other and connect the first sensing electrode 410 to the fourth segment 30d. Each of the third sub-line 503A and the fourth sub-line 503B may be connected to the first sensing electrode 410 through a fourth contact hole CNT4 and connected to the fourth segment 30d through a fifth contact hole CNT5.

The first path described with reference to FIG. 10, for example, the structure in which the first line 501, the first segment 30a, the second line 502, the fourth segment 30d, and the third line 503 are connected may also be applied to the second pass in which the eleventh line 511, the ninth segment 30i, the twelfth line 512, the sixth segment 30f, and the thirteenth line 513 are connected. For example, the eleventh line 511 may be connected, through a contact hole, to the first sensing electrode 410 on the upper side of the first area OA, and the ninth segment 30i. The twelfth line 512 may be connected to the ninth segment 30i and the sixth segment 30f through a contact hole, and the thirteenth line 513 may be connected, through a contact hole, to the first sensing electrode 410 on the lower side of the first area OA, and the sixth segment 30f.

In the middle area MA, a cover layer 70 closer to the first area OA than the conductive layer 30 may be arranged as shown in FIG. 10. The cover layer 70 may include the same number of pieces as a plurality of segments provided in the conductive layer 30. For example, the cover layer 70 may include first to tenth pieces, and FIG. 10 shows first to fifth pieces 70a, 70b, 70c, 70d, and 70e and a tenth piece 70j.

The pieces of the cover layer 70 may be arranged in the circumferential direction surrounding the first area OA and may be closer to the first area OA than the segments of the conductive layer 30. According to some example embodiments, the number and/or arrangement of pieces of cover layer 70 may be different from the number and/or arrangement of pieces of conductive layer 30. According to some example embodiments, at least two of the pieces of cover layer 70 may be connected to each other to form an integral body. Alternatively, the cover layer 70 may have an annular shape that is connected in one piece rather than a plurality of pieces.

The cover layer 70 may be located on a different layer than the conductive layer 30. The cover layer 70 may be formed in the process of forming the input sensing layer 40 described above with reference to FIG. 7. For example, the cover layer 70 and the conductive layer 30 may be located on different layers in the manner that the cover layer 70 is formed in the first conductive layer CML1 and the conductive layer 30 is formed in the second conductive layer CML2. The cover layer 70 may cover an end portion of an element located under the cover layer 70, and its specific structure is described below with reference to FIG. 16.

Figure 11:
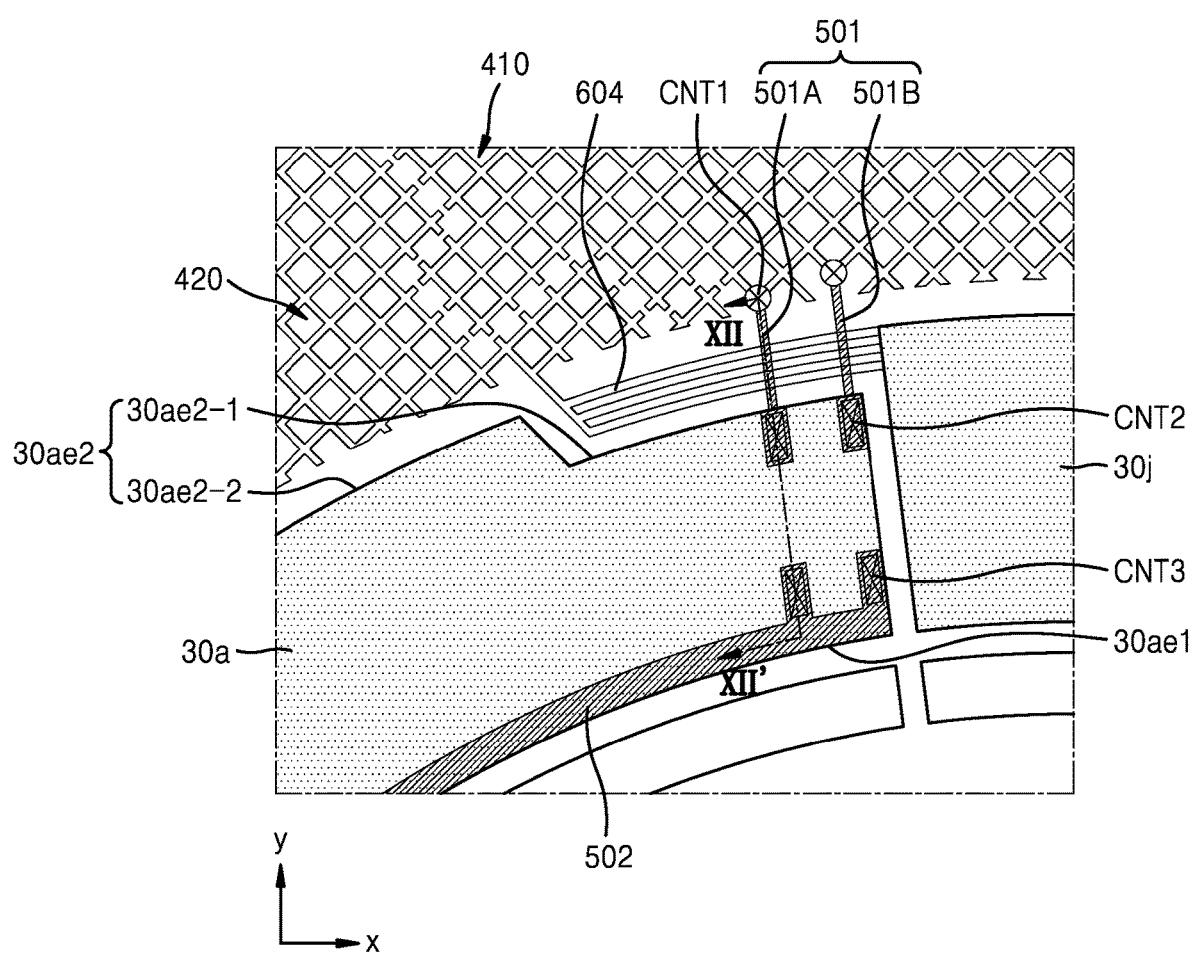
FIG. 11 is an enlarged plan view of a portion XI of FIG. 9.
Figure 12:
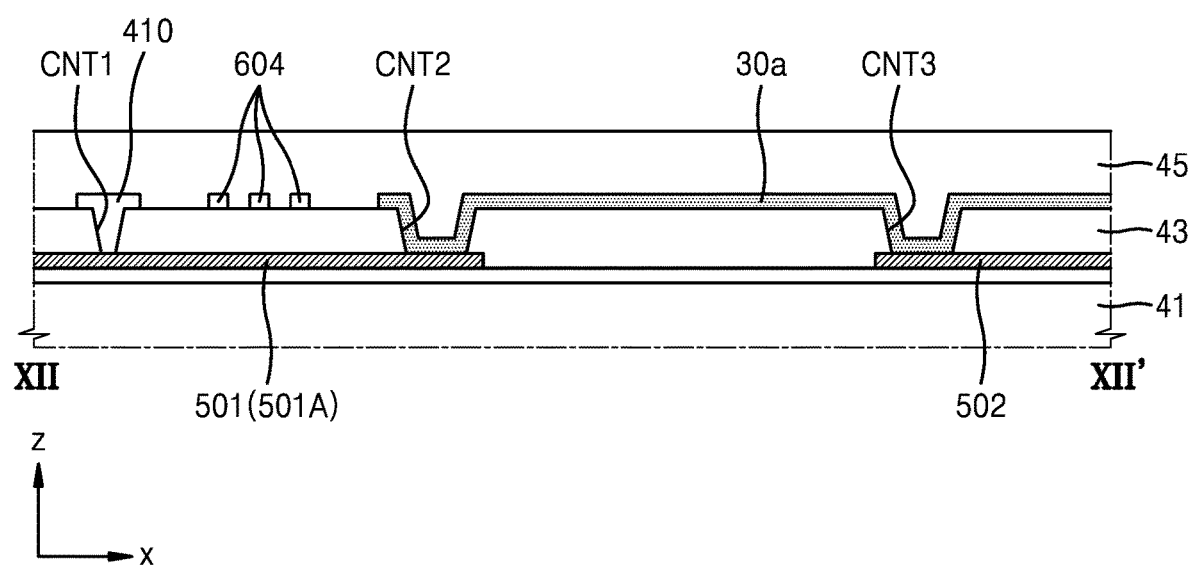
FIG. 12 is a cross-sectional view taken along a line VII-VII' of FIG. 11.

FIG. 11 is an enlarged plan view of a portion XI of FIG. 9, and FIG. 12 is a cross-sectional view taken along the line VII-VII' of FIG. 11.

Referring to FIGS. 11 and 12, the first sensing electrode 410 having a mesh structure is located on the second insulating layer 43, each of the first sub-line 501A and the second sub-line 501B is arranged on the first insulating layer 41, and the first segment 30a is located on the second insulating layer 43.

The first line 501 may be located on the first insulating layer 41 such that a first portion is below the first sensing electrode 410 and a second portion is below the first segment 30a. The first line 501 may be connected to the first sensing electrode 410 through the first contact hole CNT1 of the second insulating layer 43 and connected to the first segment 30a through the second contact hole CNT2 of the second insulating layer 43.

The second line 502 may be located on the first insulating layer 41. A first portion of the second line 502 may be located below the first segment 30a and may be connected to the first segment 30a through the third contact hole CNT3 formed in the second insulating layer 43.

The first line 501 and the second line 502 may be spaced apart from each other. For example, the first line 501 may be arranged adjacent to an outer edge 30ae2 of the first segment 30a relatively closer to the sensing electrodes, and the second line 502 may be adjacent to an inner edge 30ae1 of the first segment 30a relatively away from the sensing electrodes. One end of the first line 501 and one end of the second line 502 may be spaced apart from each other in a width direction of the first segment 30a. Here, 'the width direction of the first segment' may be understood as a radial direction from the center C (see FIG. 10) of the first area OA.

Because the first line 501 and the second line 502 are spaced apart from each other, the second contact hole CNT2 and the third contact hole CNT3 may also be spaced apart from each other. For example, the second contact hole CNT2 and the third contact hole CNT3 may be spaced apart from each other in the width direction of the first segment 30a. The second contact hole CNT2 may be arranged adjacent to the outer edge 30ae2 of the first segment 30a and the third contact hole CNT3 may be adjacent to the inner edge 30ae1 of the first segment 30a. For example, the second contact hole CNT2 and the third contact hole CNT3 may be spaced apart from each other along a line (e.g., on an imaginary line) VL (see FIG. 10) in the width direction of the first segment 30a, for example, the radial direction from the center C of the first area OA. When the above-described structure is employed, damage due to static electricity may be prevented or minimized compared with the case where the first line 501 and the second line 502 are connected to each other and integrally formed.

The fourth line 604 may overlap the first line 501. The fourth line 604 may include, for example, sub-lines connected to each other at their ends. Although it is shown in FIGS. 11 and 12 that the fourth line 604 includes three sub-lines connected to each other at their ends, the number of sub-lines may be variously changed. As the fourth line 604 includes a plurality of sub-lines, an increase in resistance may be reduced and an overlap area between the fourth line 604 and the first line 501 may be reduced.

The width of a portion of the first segment 30a may be less than that of the other portion in order to arrange the fourth line 604. For example, the outer edge 30ae2 of the first segment 30a may include a first sub-outer edge 30ae2-1 and a second sub-outer edge 30ae2-2 that extend to have a step on plane. The width (e.g., a width in the radial direction away from the center of the first area) of a portion of the first segment 30*a* corresponding to the first sub-outer edge 30*ae*2-1 may be less than the width of a portion of the first segment 30*a* corresponding to the second sub-outer edge 30*ae*2-2.

The structure of the first line 501 described with reference to FIGS. 11 and 12 may be similarly applied to the structure of the third line 503 shown in FIG. 10. For example, the third line 503 may be located on the first insulating layer 41 (see, e.g., FIG. 12) and may be connected to the first sensing electrode 410 and the fourth segment 30*d* through the fourth contact hole CNT4 and the fifth contact hole CNT5, respectively, which are formed in the second insulating layer 43. A second portion of the second line 502 may be located on the first insulating layer 41 and may be connected to the fourth segment 30*d* through a sixth contact hole CNT6 formed in the second insulating layer 43. The second line 502 and the third line 503 may be spaced apart from each other and the fifth contact hole CNT5 and the sixth contact hole CNT6 may also be spaced apart from each other, as shown in FIGS. 9 and 10.

Although it is shown in FIG. 11 that one end of the first line 501 is spaced apart from one end of the second line 502 in the width direction of the first segment 30*a* (or the radial direction from the center of the first area), embodiments according to the present disclosure are not limited thereto. According to some example embodiments, as shown in FIGS. 13 and 14, one end of the first line 501 and one end of the second line 502 may be spaced apart from each other in a lengthwise direction of the first segment 30*a*.

Figure 13:
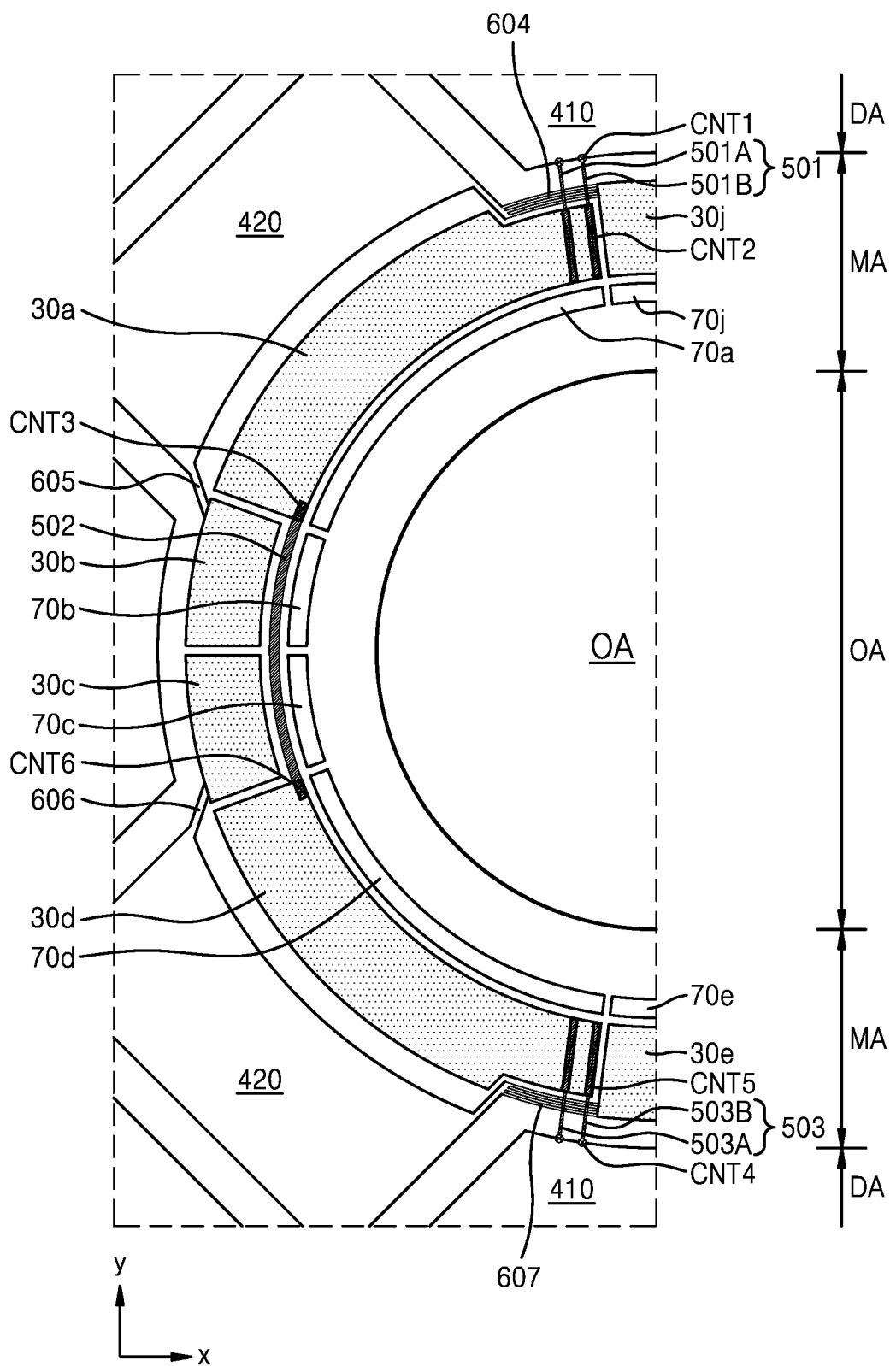
FIG. 13 is a plan view of an area around a first area of a display device according to some example embodiments.
Figure 14:
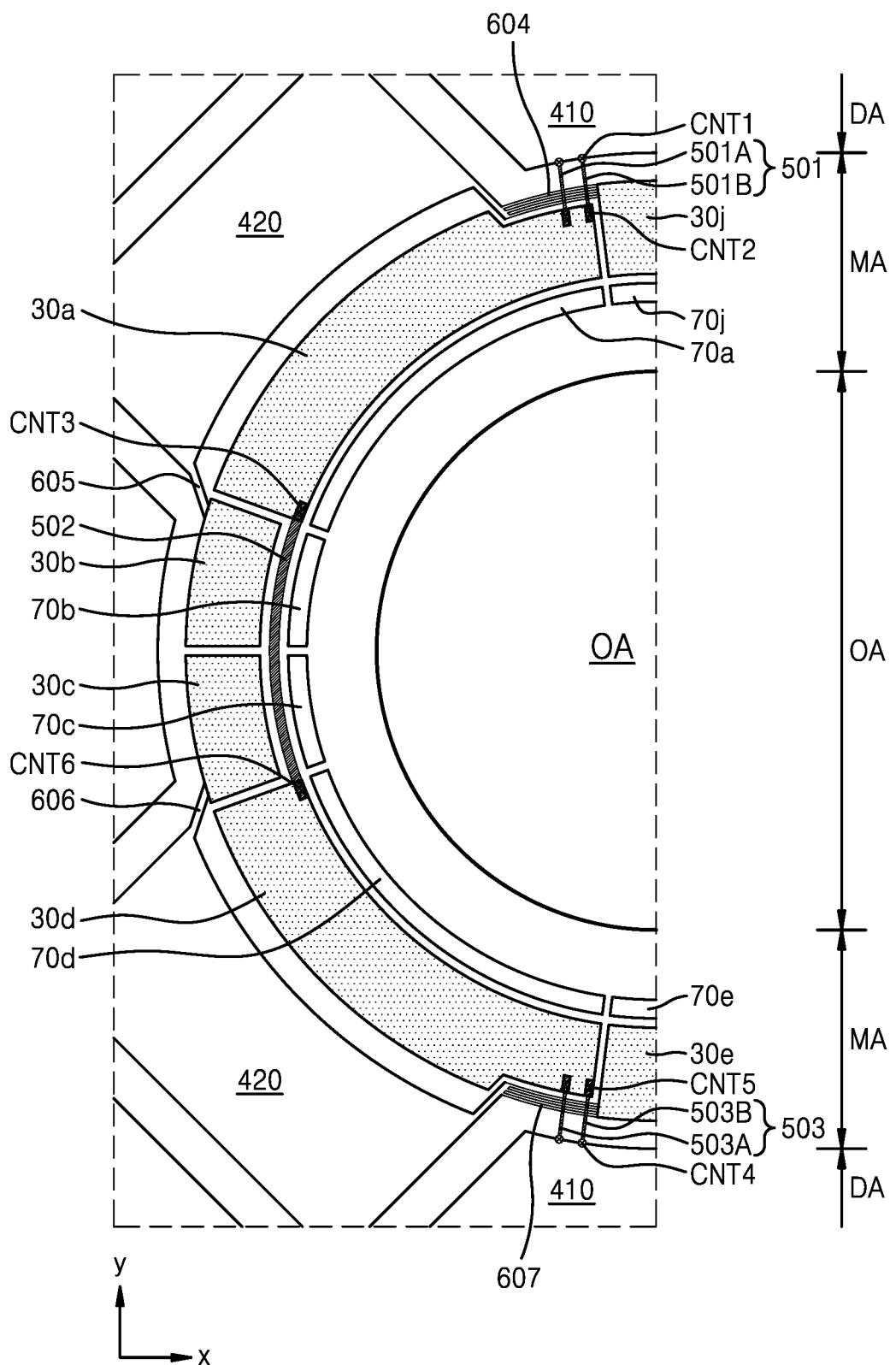
FIG. 14 is a plan view of an area around a first area of a display device according to some example embodiments.

FIG. 13 is a plan view of an area around a first area of a display device according to some example embodiments, and FIG. 14 is a plan view of an area around a first area of a display device according to some example embodiments.

Referring to FIGS. 13 and 14, one end of a first line 501 may be spaced apart from one end of a second line 502 in a lengthwise direction of a first segment 30*a*. In FIG. 14, one end of the first line 501 and one end of the second line 502 may be spaced apart from each other in the lengthwise direction of the first segment 30*a* and may also be spaced apart from each other in a width direction of the first segment 30*a*. Here, 'the lengthwise direction of the first segment' may be understood as a circumferential direction of a first area OA or an arc direction partially surrounding the periphery of the first area OA.

The first line 501 and the second line 502 may be respectively adjacent to both side edges of the first segment 30*a*, which are opposite to each other in the lengthwise direction of the first segment 30*a*. Similarly, as shown in FIG. 13, a second contact hole CNT2 for connection between the first line 501 and the first segment 30*a* and a third contact hole CNT3 for connection between the second line 502 and the first segment 30*a* may also be spaced apart from each other in the lengthwise direction of the first segment 30*a*. According to some example embodiments, as shown in FIG. 14, the second contact hole CNT2 and the third contact hole CNT3 may be spaced apart from each other in the lengthwise direction of the first segment 30*a* and may also be spaced apart from each other in the width direction of the first segment 30*a*.

The first line 501 may be elongated in the width direction of the first segment 30*a*. For example, as shown in FIG. 13, the length of one portion of the first line 501 may be substantially the same as the width of the first segment 30*a*. One end of the first line 501 extending in the width direction of the first segment 30*a* may be adjacent to an inner edge of the first segment 30*a*. Alternatively, as shown in FIG. 14, the length of one portion of the first line 501 may be less than one half of the width of the first segment 30*a*.

A contact area between the first line 501 and the first segment 30*a*, for example, the second contact hole CNT2, may be elongated in the width direction of the first segment 30*a*, as shown in FIG. 13, and the length (diameter) of the second contact hole CNT2 may be greater than about half of the maximum width of the first segment 30*a*. According to some example embodiments, as shown in FIG. 14, the length (diameter) of the second contact hole CNT2 may be less than about half of the maximum width of the first segment 30*a*.

Similar to the first line 501, one end of a third line 503 may be spaced apart from one end of the second line 502 in a lengthwise direction of a fourth segment 30*d*. The third line 503 and the second line 502 may be respectively arranged adjacent to both side edges of the fourth segment 30*d*, which are opposite to each other in a lengthwise direction of the fourth segment 30*d*, and similarly, a fifth contact hole CNT5 and a sixth contact hole CNT6 may also be spaced apart from each other in the lengthwise direction of the fourth segment 30*d*.

A contact area between the third line 501 and the fourth segment 30*d*, for example, the fifth contact hole CNT5, may be elongated in the width direction of the fourth segment 30*d*, as shown in FIG. 13, and the length (diameter) of the fifth contact hole CNT5 may be greater than about half of the width (e.g., maximum width) of the fourth segment 30*d*. According to some example embodiments, as shown in FIG. 14, the length (diameter) of the fifth contact hole CNT5 may be less than about half of the width (e.g., maximum width) of the fourth segment 30*d*.

A first end and a second end of the second line 502 may overlap the first segment 30*a* and the fourth segment 30*d*, respectively, and may be connected to the first segment 30*a* and the fourth segment 30*d* through the third contact hole CNT3 and the sixth contact hole CNT6, respectively.

Although FIGS. 11 to 14 illustrate that the first line 501 and the third line 503 include first sub-lines 501A and 501B and third and fourth sub-lines 503A and 503B, respectively, which are spaced apart from each other, embodiments according to the present disclosure are not limited thereto. According to some example embodiments, as shown in FIG. 15, the first sub-lines 501A and 501B of the first line 501 may be connected to each other and the third and fourth sub-lines 503A and 503B of the third line 503 may be connected to each other.

Figure 15:
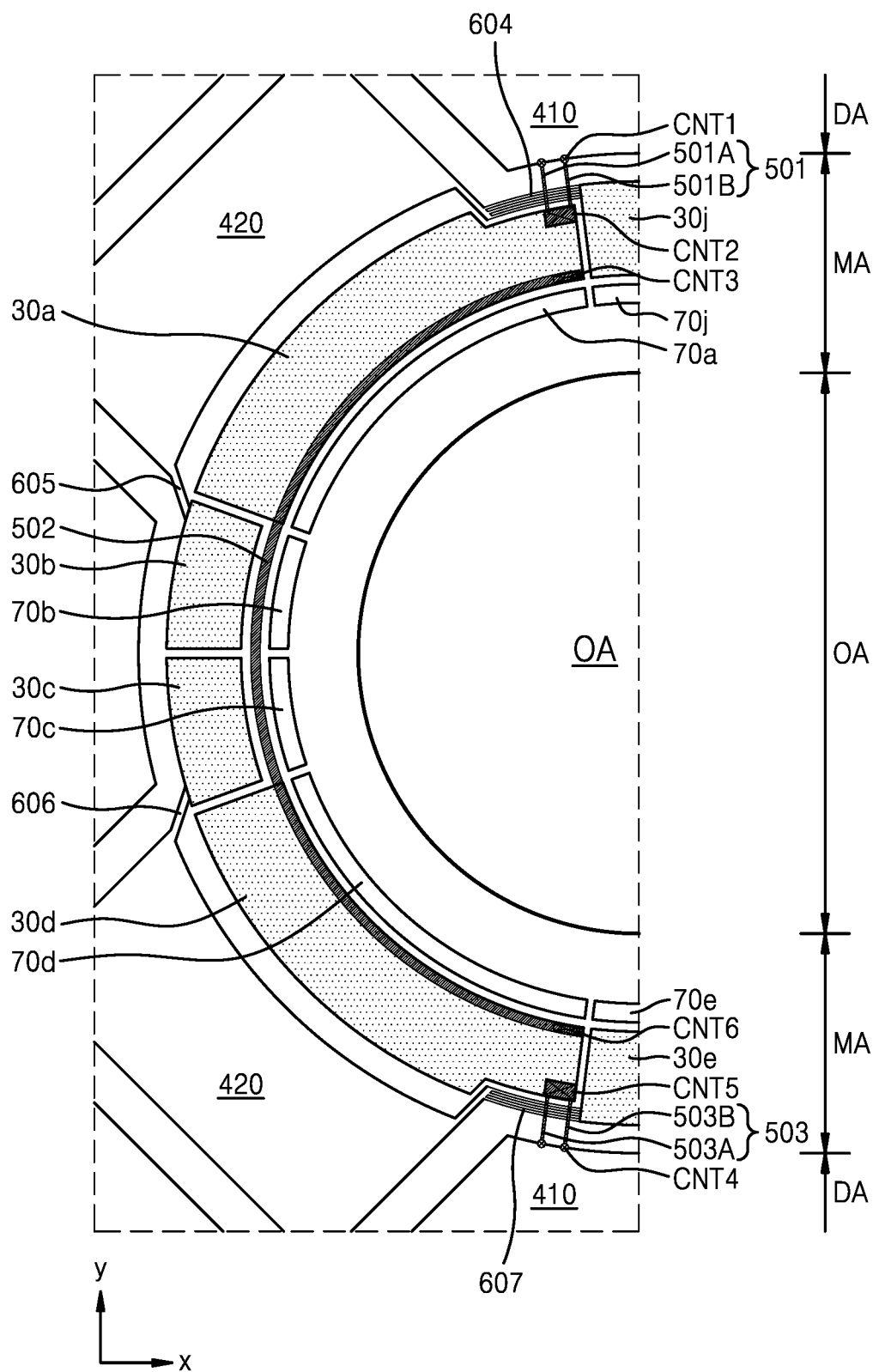
FIG. 15 is a plan view of an area around a first area of a display device according to some example embodiments.

FIG. 15 is a plan view of an area around a first area of a display device according to some example embodiments.

Referring to FIG. 15, first and second sub-lines 501A and 502B of a first line 501 may be integrally connected to each other at their ends, and a connection portion between the first and second sub-lines 501A and 502B may overlap a first segment 30*a*. The first segment 30*a* and the first line 501 may be connected through a second contact hole CNT2.

Similar to the first line 501, third and fourth sub-lines 503A and 503B of a third line 503 may be integrally connected to each other at their ends, and a connection portion between the third and fourth sub-lines 503A and 503B may overlap a fourth segment 30*d*. The fourth segment 30*d* and the third line 503 may be connected through a fifth contact hole CNT5.

A second line 502 and the first line 501 may be spaced apart from each other in a width direction of the first segment 30*a* (or a radial direction from the center of the first area). Alternatively, as described with reference to FIGS. 13 and 14, the second line 502 and the first line 501 may be spaced from each other in a lengthwise direction of the first segment 30a, or may be spaced apart from each other in a width direction and the lengthwise direction of the first segment 30a.

The second line 502 and the third line 503 may be spaced apart from each other in a width direction of the fourth segment 30d (or the radial direction from the center of the first area). Alternatively, as described with reference to FIGS. 13 and 14, the second line 502 and the third line 503 may be spaced apart from each other in a lengthwise direction of the fourth segment 30d, or may be spaced apart from in a width direction and the lengthwise direction of the fourth segment 30d.

Figure 16:
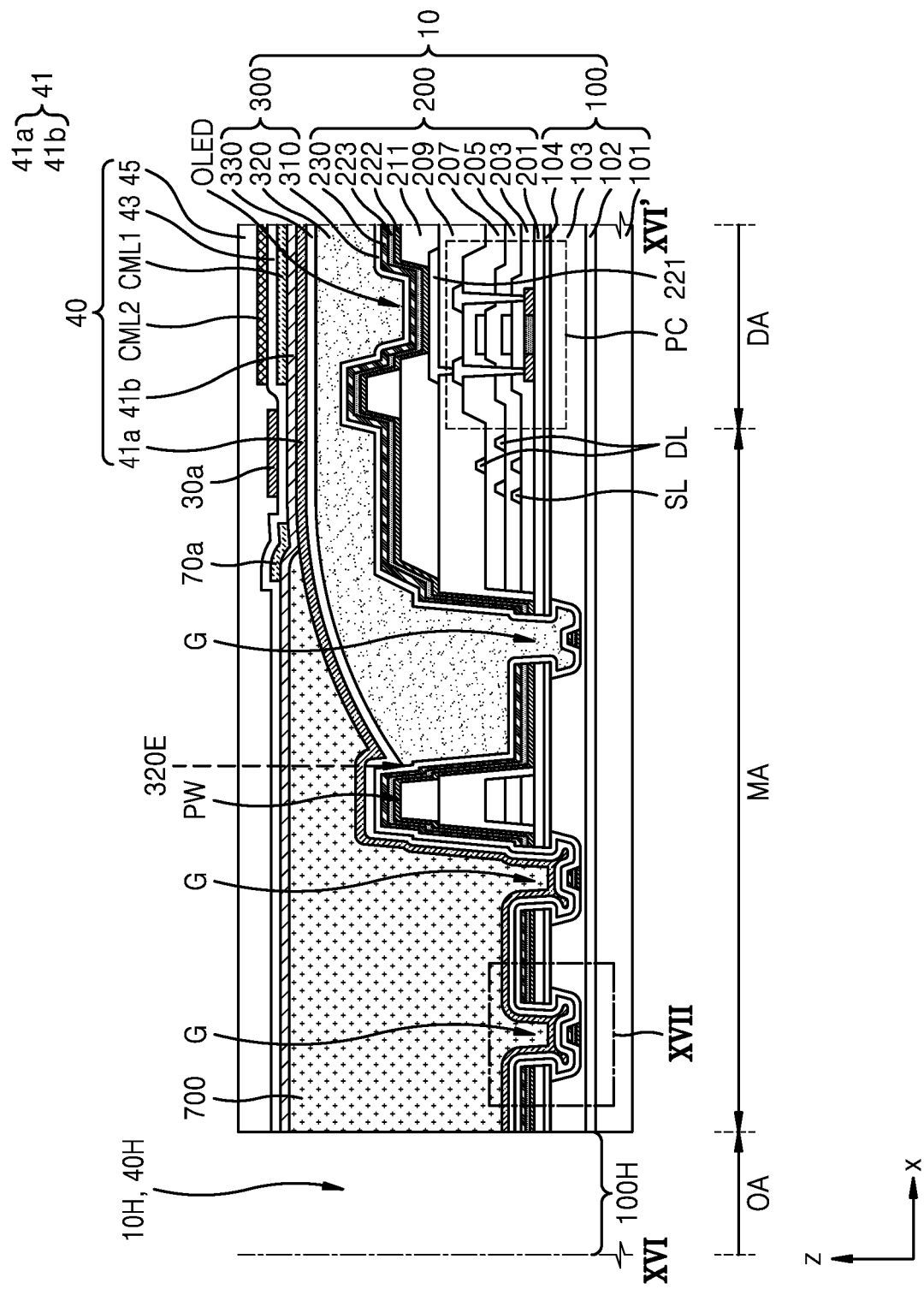
FIG. 16 is a cross-sectional view of a display device according to some example embodiments.
Figure 17:
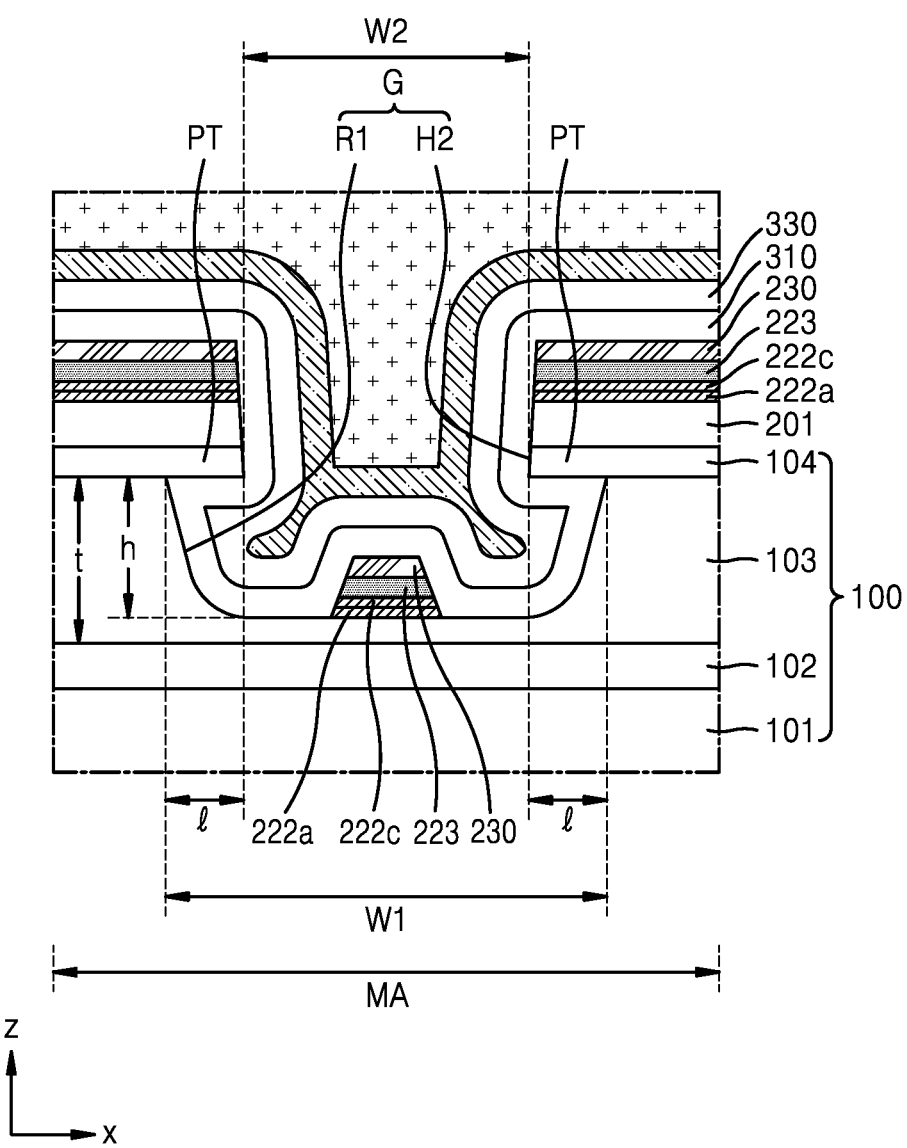
FIG. 17 is an enlarged cross-sectional view of a portion XVII of FIG. 16.

FIG. 16 is a cross-sectional view of a display device according to some example embodiments, wherein the cross-sectional view corresponds to a cross section taken along the line XVI-XVI' of FIG. 9, and FIG. 17 is an enlarged cross-sectional view of a portion XVII of FIG. 16.

Referring to FIG. 16, a display panel 10 may include a first opening 10H located in a first area OA, and an input sensing layer 40 arranged on the display panel 10 may also include a second opening 40H located in the first area OA. Layers constituting the display panel 10, for example, a substrate 100, a display layer 200, and a thin film encapsulation layer 300, may respectively include openings, and the openings may overlap each other to form the first openings 10H of the display panel 10. In this regard, FIG. 16 shows an opening 100H formed in the substrate 100.

The substrate 100 may include a glass material or a polymer. For example, the substrate 100 may have a multi-layer structure. For example, the substrate 100 may include a first base layer 101, a first barrier layer 102, a second base layer 103, and a second barrier layer 104, which are sequentially stacked. Each of the first base layer 101 and the second base layer 103 may include a polymeric resin and each of the first barrier layer 102 and the second barrier layer 04 may include an inorganic insulating material, and when such a structure is employed, flexibility may be improved.

Referring to a display area DA in FIG. 16, a pixel circuit PC may be arranged on the substrate 100 and may include a thin film transistor, a storage capacitor, and the like. An insulating layer may be interposed between a semiconductor layer and electrodes of the thin film transistor and between electrodes of the storage capacitor, and in this regard, FIG. 16 shows a buffer layer 201, a gate insulating layer 203, a first interlayer insulating layer 205, and a second interlayer insulating layer 207, which are stacked on the substrate 100. The pixel circuit PC may be covered with a first organic insulating layer 209 and a pixel electrode 221 may be arranged on the first organic insulating layer 209.

A pixel defining layer 211, which covers the edge of the pixel electrode 221 and exposes the pixel electrode 221, may be located on the pixel electrode 221, and an intermediate layer 222, which overlap the pixel electrode 221, and an opposite electrode 223 may be located on the pixel defining layer 211. The pixel electrode 221, the intermediate layer 222, and the opposite electrode 223, which are sequentially stacked, may form an organic light-emitting diode OLED, and an emission layer included in the intermediate layer 222 may include a low-molecular organic material or polymer organic material capable of emitting red, green, blue, or white light. The organic light-emitting diode OLED may emit red, green, blue, or white light.

The organic light emitting diode OLED is covered with the thin film encapsulation layer 300. The thin film encapsulation layer 300 may include at least one inorganic encapsulation layer and at least one organic encapsulation layer. According to some example embodiments, as illustrated in FIG. 16, the thin film encapsulation layer 300 may include first and second inorganic encapsulation layers 310 and 330 and an organic encapsulation layer 320 therebetween. According to some example embodiments, the number of organic encapsulation layers, the number of inorganic encapsulation layers, and a stacking order may be changed.

Each of the first inorganic encapsulation layer 310 and the second inorganic encapsulation layer 330 may include one or more inorganic materials selected from aluminum oxide, titanium oxide, tantalum oxide, hafnium oxide, zinc oxide, silicon oxide, silicon nitride, and silicon oxynitride. Each of the first inorganic encapsulation layer 310 and the second inorganic encapsulation layer 330 may include a single layer or multiple layers including the above-described one or more inorganic materials. The organic encapsulation layer 320 may include a polymer-based material. Examples of the polymer-based material may include polymethyl methacrylate, an acrylic resin such as polyacrylic acid, an epoxy resin, polyimide, and polyethylene. According to some example embodiments, the organic encapsulation layer 320 may include acrylate polymer.

Referring to a middle area MA in FIG. 16, data lines DL and/or scan lines SL may be located in the middle area MA. The data lines DL and/or the scan lines SL of the middle area MA correspond to trace lines that detour around the first area OA, described above with reference to FIG. 5. The above-mentioned lines arranged in the middle area MA may overlap segments to be described below.

Grooves G may be located in the middle area MA. The grooves G may have predetermined depths in a thickness direction of the substrate 100. Although three grooves G are shown in FIG. 16, the number of grooves G may be changed.

Each of the grooves G may be formed in a multi-layer film including a first layer (e.g., a polymer resin layer) and a second layer (e.g., an inorganic insulating layer), which include different materials, and according to some example embodiments, FIG. 16 shows that the groove G is formed in sub-layers provided in the substrate 100, for example, in the second base layer 103 and the second barrier layer 104 of the substrate 100.

Referring to FIG. 17, a depth h of the groove G may be less than a thickness t of the second base layer 103. In this case, the groove G may include a second hole H2 formed in the second barrier layer 104 and a first recess R1 formed in the second base layer 103. In another example, the depth h of the groove G may be substantially the same as the thickness t of the second base layer 103, in which case the groove G may include the second hole H2 formed in the second barrier layer 104 and a first hole formed in the second base layer 103.

The side surface of the second barrier layer 104 defining the second hole H2 may protrude farther toward the center of the groove G than the side surface of the second base layer 103 defining the first recess R1 or the first hole. Portions of the second barrier layer 104 including the aforementioned side surface may form a pair of tips PT.

The groove G may have an undercut section in which a width W1 of the first recess R1 or the first hole of the second base layer 103 is greater than a width W2 of the second hole H2 formed in the second barrier layer 104. The groove G having the undercut section may be formed before the formation of at least one organic layer included in the organic light-emitting diode OLED, for example, the intermediate layer 222. At least one organic layer included in the intermediate layer 222, for example, a first functional layer 222a and/or a second functional layer 222c shown in FIG. 17, may be disconnected or separated by the groove G.

Similarly, the opposite electrode 223 may also be disconnected by the groove G. A capping layer 230 including LiF may be arranged on the opposite electrode 223, and the capping layer 230 may be a common layer entirely formed on the substrate 100, like the first functional layer 222*a*, the second functional layer 222*c*, and the opposite electrode 223 and may be disconnected by the grooves G. According to some example embodiments, the capping layer 230 may be omitted.

The first and second inorganic encapsulation layers 310 and 330 covering the organic light-emitting diode OLED may extend to the middle area MA. The first and second inorganic encapsulation layers 310 and 330 may be formed by chemical vapor deposition (CVD) or the like. The first inorganic encapsulation layer 310 may continuously cover the inner surface of the groove G.

The organic encapsulation layer 320 may cover the display area DA, and an edge 320E of the organic encapsulation layer 320 may be located on one side of a partition wall PW. The organic encapsulation layer 320 may include a polymer formed applying a monomer and curing the applied monomer, and the flow of the monomer may be controller by the partition wall 500 and the thickness of the organic encapsulation layer 320 may be controlled by the partition wall 500. Alternatively, the organic encapsulation layer 320 may be formed applying a polymer. The edge 320E of the organic encapsulation layer 320 may be spaced apart from the first opening 10H, and an area in which the first inorganic encapsulation layer 310 and the second inorganic encapsulation layer 330 are in direct contact with each other may be located between the first opening 10H and the organic encapsulation layer 320.

A planarization layer 700 may be located in the middle area MA. The planarization layer 700 may be located only in the middle area MA. The planarization layer 700 may include an organic insulating layer. For example, the planarization layer 700 may include a silicon resin, an acrylic resin, an epoxy resin, or a polymer-based material such as polyimide and polyethylene. The planarization layer 700 may include a different material than that of the organic encapsulation layer 320. For example, one of the organic encapsulation layer 320 and the planarization layer 700 may include a silicon resin and the other may include an acrylic resin. According to some example embodiments, the organic encapsulation layer 320 and the planarization layer 700 may include the same material.

The planarization layer 700 may cover at least one groove G. The planarization layer 700 may cover an area not covered by the organic encapsulation layer 320 in the middle area MA, thereby increasing the flatness of the display panel 10. Therefore, the problem that the input sensing layer 40 arranged on the display panel 10 is separated or dropped may be prevented. A portion of the planarization layer 700 may overlap a portion of the organic encapsulation layer 320.

The input sensing layer 40 may include a first insulating layer 41, and the first insulating layer 41 may include a first sub-insulating layer 41*a* and a second sub-insulating layer 41*b*. Each of the first sub-insulating layer 41*a* and the second sub-insulating layer 41*b* may extend from the display area DA to the middle area MA. The first sub-insulating layer 41*a* may be located below the planarization layer 700 and the second sub-insulating layer 41*b* may be located above the planarization layer 700.

The input sensing layer 40 includes a first conductive layer CML1 and a second conductive layer CML2 arranged on the first insulating layer 41, and a second insulating layer 43 is located between the first conductive layer CML1 and the second conductive layer CML2. The second insulating layer 43 may also extend toward the middle area MA, like the first insulating layer 41, and a third insulating layer 45 on the second conductive layer CML2 may also extend toward the middle area MA.

The segments described above with reference to FIGS. 9 to 15 are arranged in the middle area MA, and in this regard, FIG. 16 shows a first segment 30*a*. A conductive layer including the first segment 30*a* may at least partially cover trace lines arranged below the conductive layer, for example, a data line DL and/or a scan line SL which detour around the first area OA in the middle area MA, and thus, the aforementioned detour lines may be prevented from being viewed outside.

The pieces described above with reference to FIGS. 9 to 15 are arranged in the middle area MA, and in this regard, FIG. 16 shows a first piece 70*a*. The first piece 70*a* may cover an end portion of the planarization layer 700 arranged under the first piece 70*a*, thereby preventing the end portion of the planarization layer 700 from being separated or lifted.

Figure 18:
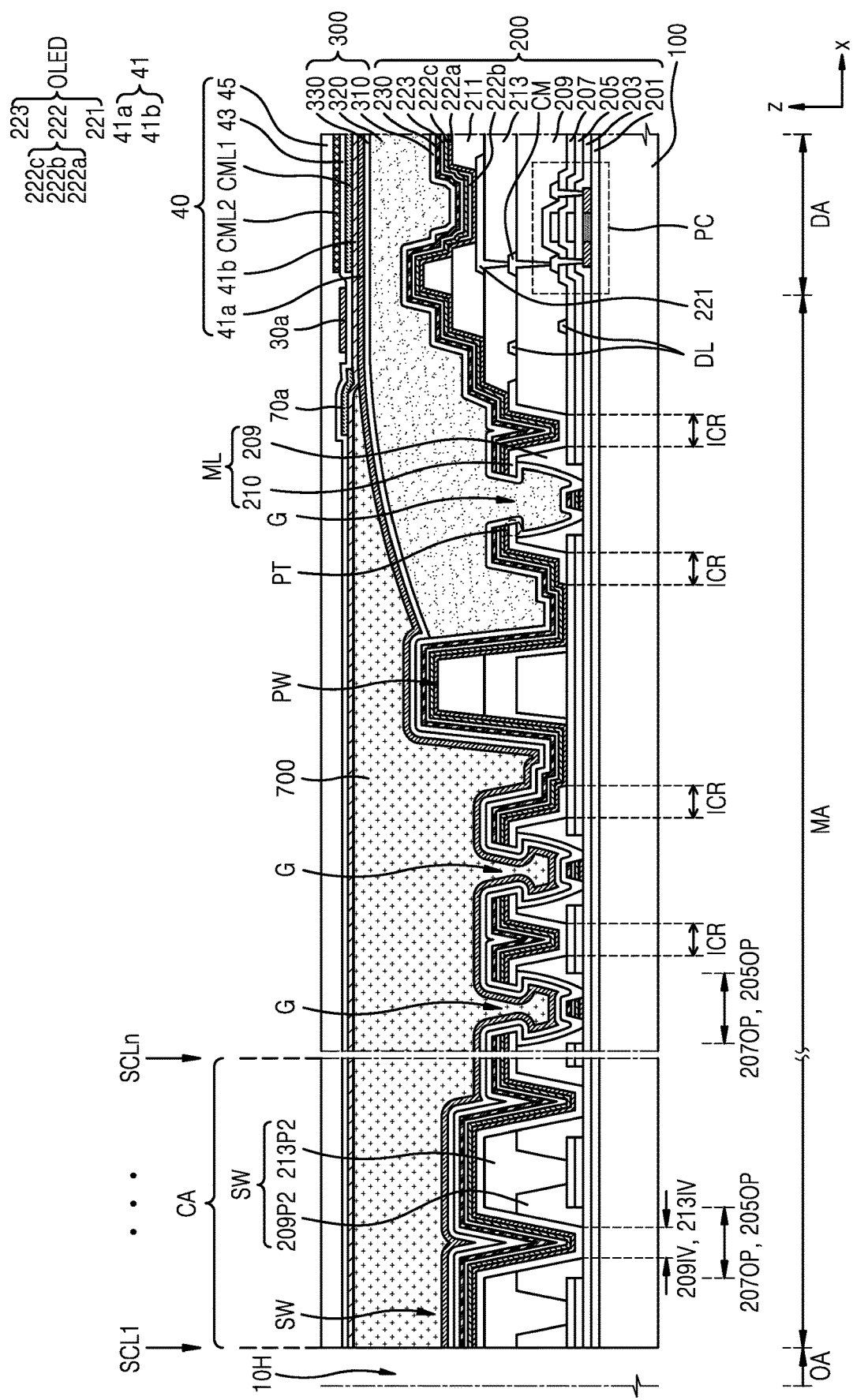
FIG. 18 is a cross-sectional view of a display device according to some example embodiments.

FIG. 18 is a cross-sectional view of a display device according to some example embodiments.

Referring to FIG. 18, in a display area DA, a pixel circuit PC is located on a substrate 100, as shown in FIG. 16, and an organic light-emitting diode OLED electrically connected to the pixel circuit PC is arranged. The organic light-emitting diode OLED includes a pixel electrode 221, an intermediate layer 222, and an opposite electrode 223. According to some example embodiments, FIG. 18 shows that the intermediate layer 222 includes an emission layer 222*b*, a first functional layer 222*a* arranged below the emission layer 222*b*, and a second functional layer 222*c* arranged above the emission layer 222*b*.

A second organic insulating layer 213 and a contact metal layer CM may be further arranged between the pixel circuit PC and the organic light-emitting diode OLED. The second organic insulating layer 213 may include an organic insulating material and/or an inorganic insulating material. The contact metal layer CM may include a conductive material including molybdenum (Mo), aluminum (Al), copper (Cu), titanium (Ti), or the like and may include a single layer or multiple layers including the above-mentioned one or more materials. According to some example embodiments, the contact metal layer CM may include multiple layers of Ti/Al/Ti.

Referring to the middle area MA, a groove G may be arranged in the middle area MA, and the groove G may be formed in a multi-layer film ML arranged on the substrate 100. The multi-layer film ML may include a first organic insulating layer 209 and an inorganic layer 210 thereon, which include different materials. The first organic insulating layer 209 may include an organic insulating material, and the inorganic layer 210 may include a metal layer or an inorganic insulating layer. For example, the inorganic layer 210 may include the same metal as that of the contact metal layer CM. Alternatively, the inorganic layer 210 may include an inorganic insulating material such as silicon nitride, silicon oxide, silicon oxynitride, or the like.

The groove G may be formed in the first organic insulating layer 209 and the inorganic layer 210. The groove G may include a first hole or first recess formed in the first organic insulating layer 209 and a second hole formed in the inorganic layer 210.

The side surface of the inorganic layer 210 defining the second hole may protrude farther toward the center of the groove G than the side surface of the first organic insulating layer 209 defining the first hole or first recess. Portions of the inorganic layer 210, which include the side surface and protrude toward the center of the groove G, may form a pair of tips PT. The first functional layer 222a and/or the second functional layer 222c, and the opposite electrode 223 may be disconnected by the groove G, as described above.

A contact area ICR in which the inorganic layer 210 and a second interlayer insulating layer 207 are in direct contact with each other may be formed around the groove G. The inorganic layer 210 may directly contact the upper surface of the second interlayer insulating layer 207 through an opening formed in the first organic insulating layer 209. The contact area ICR is a contact area between inorganic layers, and when the middle area MA includes the contact area ICR, moisture may be blocked from moving to the display area DA through the first organic insulating layer 209.

Insulating layers arranged under the multi-layer film ML in which the groove G is formed may include openings overlapping the groove G. For example, the second interlayer insulating layer 207 and a first interlayer insulating layer 205 may respectively include openings 207OP and 205OP overlapping the groove G, and in this case, the groove G may be relatively deep. According to some example embodiments, the second interlayer insulating layer 207 and the first interlayer insulating layer 205 may not include openings overlapping the groove G.

An organic element SW may be located in a portion of the middle area MA which is adjacent to the opening area OA. The organic element SW, which is a kind of crack prevention structure, may include a portion 209P2 of the first organic insulating layer 209 and a portion 213P2 of the second organic insulating layer 213. The portion 209P2 of the first organic insulating layer 209 and the portion 213P2 of the second organic insulating layer 213 may be in direct contact with each other. For example, a hole may be formed in the portion 209P2 of the first organic insulating layer 209 and the portion 213P2 of the second organic insulating layer 213 may be located in the hole, and thus, a contact area may increase.

A plurality of organic elements SW may be provided and may be spaced apart from each other. A spacing space 209IV may be provided between neighboring organic elements SW, for example, between portions 209P2 of the first organic insulating layer 209 and between portions 213P2 of the second organic insulating layer 213.

A planarization layer 700 may be located on the middle area MA including the structures described above. The planarization layer 700 may be located only in the middle area MA, as described above, and the specific material of the planarization layer 700 is as described above.

First and second sub-insulating layers 41a and 41b may be respectively located below and above the planarization layer 700, and the pieces described with reference to FIGS. 9 to 15 are arranged on an edge of the planarization layer 700 which is adjacent to the display area DA, and in this regard, FIG. 18 shows a first piece 70a. A stack structure on the planarization layer 700, for example, a structure including the second sub-insulating layer 41b, the pieces and a first conductive layer CML1, a second insulating layer 43, a second conductive layer CML2, and a third insulating layer 45, are the same as that described above with reference to FIG. 16, and thus, the description given above may be referred to.

Although FIG. 18 shows three grooves G, the number of grooves G may be changed.

Although the above-described embodiments describe the thin film encapsulation layer 300 as a sealing member, embodiments according to the present disclosure are not limited thereto. According to some example embodiments, the sealing member may include a rigid encapsulation substrate.

Figure 19:
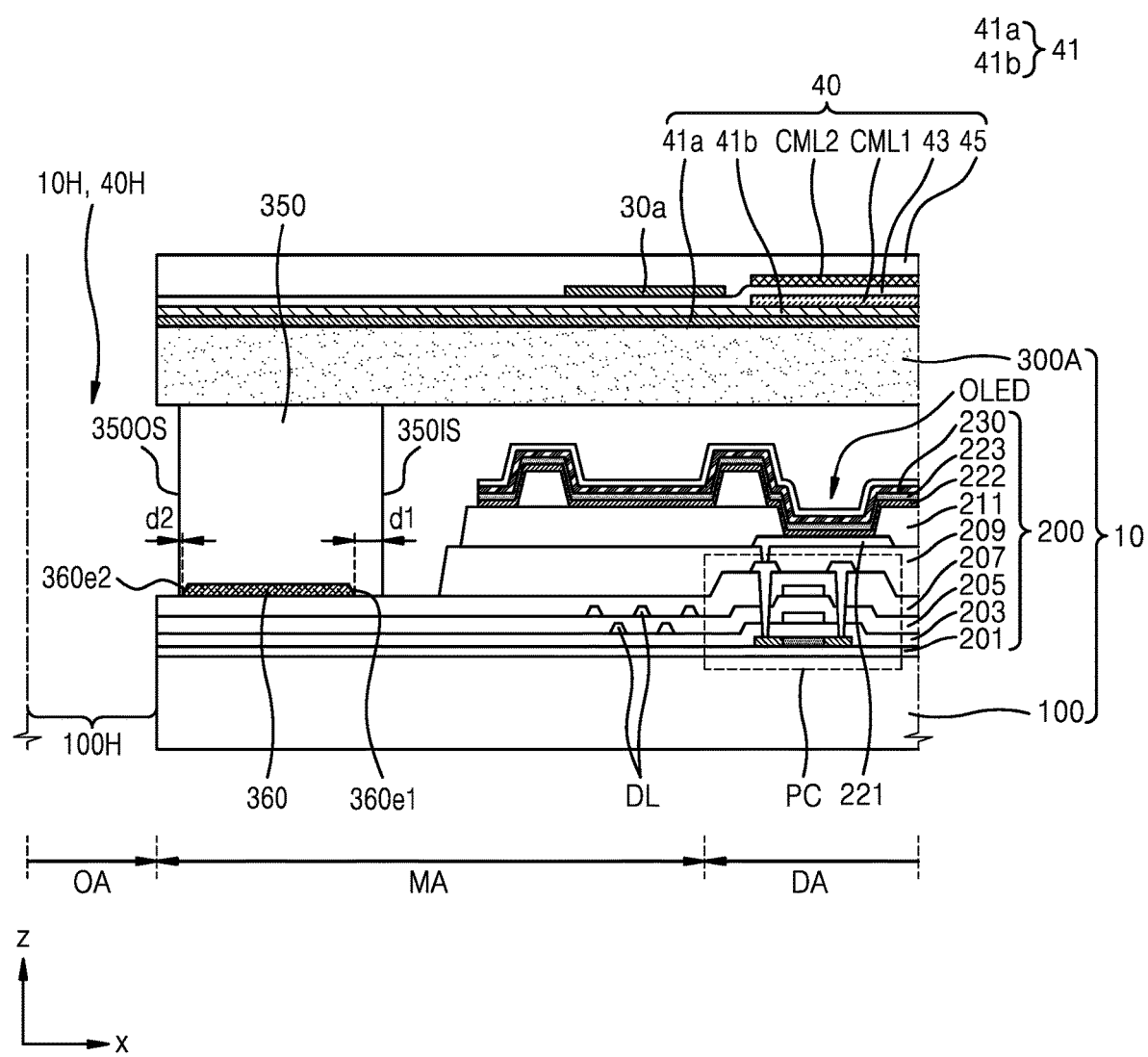
FIG. 19 is a cross-sectional view of a display device according to some example embodiments.

FIG. 19 is a cross-sectional view of a display device according to some example embodiments.

Referring to FIG. 19, the structures of a pixel circuit PC and an organic light-emitting diode OLED in a display area DA may be the same as those described above with reference to FIG. 16. Alternatively, in the display area DA, a contact metal layer CM (see FIG. 18) may be further included between the pixel circuit PC and the organic light-emitting diode OLED, as described above with reference to FIG. 18.

The organic light-emitting diode OLED may be covered with an encapsulation substrate 300A. The encapsulation substrate 300A and a substrate 100 may include a rigid material such as a glass material.

A sealing member 350 is arranged between the substrate 100 and the encapsulation substrate 300A. The sealing member 350 may include, in an peripheral area PA (see FIG. 3), a first portion that entirely surrounds the display area DA, and may include, in a middle area MA, a second portion that surrounds a first area OA, and in this regard, FIG. 19 shows the second portion. The sealing member 350 may include an inorganic material such as frit. Alternatively, the sealing member 350 may include a material such as an epoxy.

A sealing metal layer 360 may be arranged under the sealing member 350. The sealing metal layer 360 may improve the bonding force of the sealing member 350 on the substrate 100. The sealing metal layer 360 may include the same material as electrodes respectively connected to a source area and/or a drain area of a transistor provided in the pixel circuit PC, for example, a source electrode and/or a drain electrode on the second interlayer insulating layer 207. The sealing metal layer 360 may include Mo, Al, Cu, Ti, or the like and may include a single layer or multiple layers including the above-mentioned one or more materials. For example, the sealing metal layer 360 may have a structure in which a Ti layer, an Al layer, and a Ti layer are sequentially stacked.

The width of the sealing metal layer 360 may be less than the width of the sealing member 350. The sealing metal layer 360 may be at least partially covered by the sealing member 350. For example, the sealing metal layer 360 may be partially covered entirely by the sealing member 350.

The sealing metal layer 360 may be biased (i.e., offset) toward the first area OA with respect to the center points of a first side 350IS and a second side 350OS of the sealing member 350. A distance d1 (where d1>0(zero)) between a first edge 360e1 of the sealing metal layer 360 adjacent the display area DA and the first side 350IS of the sealing member 350 adjacent to the display area DA may be greater than a distance d2 (where d2≥0(zero)) between a second edge 360e2 of the sealing metal layer 360 adjacent to the first area OA and the second side 350OS of the sealing member 350 adjacent to the first area OA.

An input sensing layer 40 may be located on the encapsulation substrate 300A. For example, the input sensing layer 40 may include a first insulating layer 41, a first conductive layer CML1, a second insulating layer 43, a second conductive layer CML2, and a third insulating layer 45, and the first insulating layer 41 may include first and second sub-insulating layers 41a and 41b. According to some example embodiments, the first insulating layer 41 may include only the second sub-insulating layer 41b. Alternatively, the first insulating layer 41 may be omitted.

The segments described with reference to FIGS. 9 to 15 may be arranged in a portion of a middle area MA adjacent to the display area DA. The segments may overlap the underlying lines, e.g., data lines DL that detour around the first area OA. In this regard, FIG. 19 shows a first segment 30*a*.

The data lines DL (e.g., portions of the data lines DL) may be located on a gate insulating layer 203 or a first interlayer insulating layer 205 in the middle area MA. One of the neighboring data lines DL is arranged on the gate insulating layer 203 and the other is arranged on the first interlayer insulating layer 205, that is, the neighboring data lines DL are alternately arranged on different layers, and thus, the pitch between the data lines DL may be reduced.

The segments may be spaced apart from the sealing member 350. The end of each of the segments adjacent to the first area OA might not overlap the sealing member 350 and may be arranged closer to the display area DA than the sealing member 350.

Figure 20:
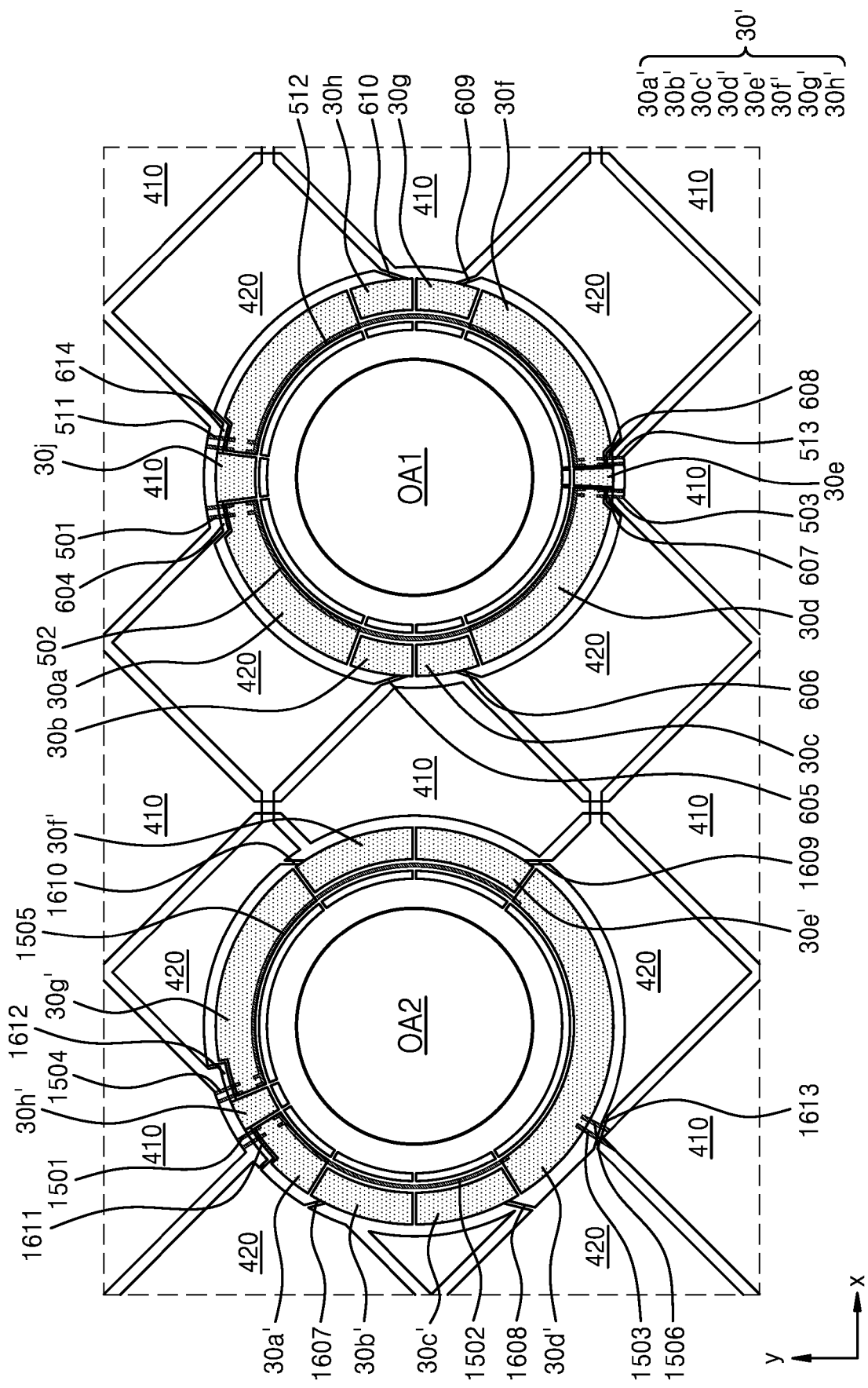
FIG. 20 is a plan view of a portion of a display device according to some example embodiments.

FIG. 20 is a plan view of a portion of a display device according to some example embodiments.

Referring to FIG. 20, the display device may include a plurality of first areas. For example, as shown in FIG. 20, the display device may include two first areas OA1 and OA2. Because peripheral elements of the first area OA1 shown on the right-hand side, from among the two first areas OA1 and OA2, may be the same as those in any one of the embodiments described above with reference to FIGS. 9 to 18, the descriptions given above may be referred to.

With respect to the first area OA2 shown on the left-hand side, first sensing electrodes 410 may be spaced apart from each other with the first area OA2 therebetween and second sensing electrodes 420 may be spaced apart from each other with the first area OA2 therebetween. A conductive layer 30' may be arranged between the first area OA2 shown on the left-hand side and the first and second sensing electrodes 410 and 420, and the conductive layer 30' may include a plurality of segments. For example, FIG. 20 shows that the conductive layer 30' includes first to eighth segments 30*a*', 30*b*', 30*c*', 30*d*', 30*e*', 30*f*', 30*g*', and 30*h*'.

At least one of the first to eighth segments 30*a*', 30*b*', 30*c*', 30*d*', 30*e*', 30*f*', 30*g*', or 30*h*' may be electrically connected to a sensing electrode. For example, the first segment 30*a*' may be electrically connected to the first sensing electrode 410 through a first line 1501, the second segment 30*b*' may be electrically connected to the second sensing electrode 420 through a seventh line 1607, and the third segment 30*c*' may be electrically connected to the second sensing electrode 420 through an eighth line 1608. The fourth segment 30*d*' may be electrically connected to the first sensing electrode 410 through a third line 1503 and a sixth line 1506, the fifth segment 30*e*' may be electrically connected to the second sensing electrode 420 through a ninth line 1609, and the sixth segment 30*f* may be electrically connected to the second sensing electrode 420 through a tenth line 1610. The seventh segment 30*g*' may be electrically connected to the first sensing electrode 410 through a fourth line 1504, and the eighth segment 30*h*' may be electrically connected to the second sensing electrode 420 through an eleventh line 1611 and a twelfth line 1612.

The first and second sensing electrodes 410 and 420 spaced apart from each other around the first area OA2 shown on the left-hand side may be electrically connected using lines and segments.

The first sensing electrodes 410 on the upper side and the lower side of the first area OA2 may be electrically connected through the first line 1501, the first segment 30*a*', the second line 1502, the fourth segment 30*d*', and the third line 1503. The first line 1501, the first segment 30*a*', the second line 1502, the fourth segment 30*d*', and the third line 1503 may have substantially the same structure as the first path described above with respect to FIGS. 9 and 10.

For example, the first to third lines 1501, 1502, and 1503 may be formed in the first conductive layer CML1 described with reference to FIG. 7 and the first sensing electrodes 410, the first segment 30*a*', and the fourth segment 30*d*' may be formed in the second conductive layer CML2, and they may be electrically connected through contact holes formed in the second insulating layer 43 in FIG. 7. In this case, the first to third lines 1501, 1502, and 1503 and the contact holes may be spaced apart from each other as described above with reference to FIGS. 10 to 15.

Similarly, the first sensing electrodes 410 on the upper and lower sides of the first area OA2 may be electrically connected to the fourth line 1504, the seventh segment 30*g*', the fifth line 1505, the fourth segment 30*d*', and the sixth line 1506. An electrical connection structure formed by the fourth line 1504, the seventh segment 30*g*', the fifth line 1505, the fourth segment 30*d*', and the sixth line 1506 may have the substantially the same structure as the second path described above with reference to FIGS. 9 and 10.

The width of each of the segments (e.g., the second segment 30*b*' and the third segment 30*c*') arranged between segments connected to the second line 1502 may be less than the width of a segment (e.g., the first segment 30*a*') connected to the second line 1502. Likewise, the width of each of the segments (e.g., the fifth segment 30*e*' and the sixth segment 30*f*') arranged between segments connected to the fifth line 1505 may be less than the width of a segment (e.g., the seventh segment 30*g*') connected to the fifth line 1505.

The second sensing electrodes 420 on the upper left side and the upper right side of the first area OA2 may be electrically connected through a path formed by the eleventh line 1611, the eighth segment 30*h*', and the twelfth line 1612. The second sensing electrodes 420 on the lower left side and the lower right side of the first area OA2 may be electrically connected through the thirteenth line 1613.

Although two first areas are shown in FIG. 20, the display device may have three or more first areas, and the structure described above with reference to FIGS. 9 to 17 may be applied equally to each of the first areas.

According to the embodiments described above, an electrical connection structure around the first area may be stably maintained, sensing sensitivity may be improved, and an input sensing layer may be prevented from being damaged by an external factor such as static electricity.

It should be understood that example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:
   a substrate including an opening and a display area surrounding the opening;

a plurality of display elements in the display area and including a first display element and a second display element spaced apart from each other about the opening;

an input sensing layer on the plurality of display elements and including two first sensing electrodes spaced apart from each other around the opening and two second sensing electrodes spaced apart from each other around the opening; and a plurality of segments between the opening and the display area, wherein the plurality of segments comprise:

a first segment electrically connected to one of the two first sensing electrodes through a first line; and a second segment electrically connected to the first segment through a second line.

2. The display device of claim 1, wherein an end of the first line and an end of the second line are spaced apart from each other in at least one of a width direction or a lengthwise direction of the first segment.

3. The display device of claim 1, further comprising:

an insulating layer between the first line and the first segment and between the second line and the first segment, wherein the first segment is connected to the first line through a first contact hole in the insulating layer and is connected to the second line through a second contact hole in the insulating layer.

4. The display device of claim 3, wherein the first contact hole and the second contact hole are spaced apart from each other.

5. The display device of claim 4, wherein the first segment comprises an inner edge adjacent to the opening and an outer edge opposite to the inner edge, wherein the first contact hole is adjacent to the outer edge of the first segment and the second contact hole is adjacent to the inner edge of the first segment.

6. The display device of claim 5, wherein the first contact hole and the second contact hole are arranged along a line in a radial direction from a center of the opening and are spaced apart from each other along the line.

7. The display device of claim 5, wherein the first contact hole and the second contact hole are spaced apart from each other in a circumferential direction surrounding the opening.

8. The display device of claim 7, wherein a length of the first contact hole is greater than one half of a width of the first segment, in a plan view.

9. The display device of claim 1, wherein the second segment is electrically connected to the other of the two first sensing electrodes through a third line.

10. The display device of claim 9, further comprising:

an insulating layer between the second line and the second segment and between the third line and the second segment, wherein the second segment is connected to the second line through a third contact hole in the insulating layer and is connected to the third line through a fourth contact hole in the insulating layer.

11. The display device of claim 10, wherein the third contact hole and the fourth contact hole are spaced apart from each other.

12. The display device of claim 1, wherein the plurality of segments comprise a same material as the first sensing electrodes or the second sensing electrodes.

13. The display device of claim 1, wherein the plurality of segments are spaced apart from each other in a circumferential direction surrounding the opening.

14. The display device of claim 13, wherein the plurality of segments further comprise:

a third segment located between the first segment and the second segment.

15. The display device of claim 14, wherein the third segment is electrically connected to any one of the two second sensing electrodes.

16. The display device of claim 14, wherein the third segment is spaced apart from the second line when viewed in a direction perpendicular to an upper surface of the substrate.

17. The display device of claim 14, wherein a width of the third segment is less than a width of the first segment.

18. A display device comprising:

a substrate including a first area, a second area surrounding the first area, and a third area between the first area and the second area;

a plurality of display elements in the second area;

a plurality of sensing electrodes on the plurality of display elements;

a plurality of segments in the third area and spaced apart from each other in a circumferential direction surrounding the first area;

a first line connected to a first segment of the plurality of segments; and a second line connected to the first segment and spaced apart from the first line.

19. The display device of claim 18, further comprising:

an insulating layer between the first line and the first segment and between the second line and the first segment, wherein the first line and the first segment are connected to each other through a first contact hole in the insulating layer and the second line and the first segment are connected to each other through a second contact hole in the insulating layer.

20. The display device of claim 19, wherein the first contact hole and the second contact hole are spaced apart from each other in at least one of a width direction or a lengthwise direction of the first segment.

21. The display device of claim 20, wherein the first segment comprises an inner edge adjacent to the first area and an outer edge opposite to the inner edge, wherein the first contact hole is arranged adjacent to the outer edge of the first segment and the second contact hole is arranged adjacent to the inner edge of the first segment.

22. The display device of claim 21, wherein the first contact hole and the second contact hole are arranged along a line in a radial direction from a center of the first area and are spaced apart from each other along the line.

23. The display device of claim 21, wherein the first contact hole and the second contact hole are spaced apart from each other in a circumferential direction surrounding the first area.

24. The display device of claim 19, wherein the first line extends along a width of the first segment and a length of the first contact hole is greater than one half of the width of the first segment in a plan view.

25. The display device of claim 18, wherein the plurality of sensing electrodes comprise:

two first sensing electrodes spaced apart from each other with the first area being between the two first sensing electrodes; and two second sensing electrodes spaced apart from each other with the first area being between the two second sensing electrodes.

26. The display device of claim 25, wherein
the first line is connected to one of the two first sensing electrodes, and
the second line is connected to a second segment included in the plurality of segments.

27. The display device of claim 26, wherein the second segment is electrically connected to the other of the two first sensing electrodes.

28. The display device of claim 27, further comprising:
a third line spaced apart from the second line and connected to the second segment, and
an insulating layer between the second line and the second segment and between the third line and the second segment,
wherein the second line and the second segment are connected to each other through a third contact hole in the insulating layer and the third line and the second segment are connected to each other through a fourth contact hole in the insulating layer.

29. The display device of claim 28, wherein the third contact hole and the fourth contact hole are spaced apart from each other in at least one of a width direction or a depth direction of the second segment.

30. The display device of claim 25, wherein the plurality of segments further comprise a third segment,
wherein the third segment is electrically connected to one of the two second sensing electrodes through a third line intersecting the first line.

31. The display device of claim 30, wherein one of the two second sensing electrodes, the third line, and the third segment are located on a same layer.

32. The display device of claim 30, wherein the third segment is adjacent to the first segment and the second line extends along an edge of the third segment and is spaced apart from the third segment when viewed in a direction perpendicular to an upper surface of the substrate.

33. The display device of claim 32, wherein a width of the third segment is less than a width of the first segment.

34. The display device of claim 30, wherein
the plurality of segments further comprise a fourth segment located opposite to the third segment with the first segment being between the third segment and the fourth segment,
wherein the fourth segment is electrically connected to the other of the two second sensing electrodes electrically connected to the third segment through a fourth line.

35. The display device of claim 34, wherein the fourth line overlaps the first line.

* * * * *